US006613634B2

(12) United States Patent
Ootsuka et al.

(10) Patent No.: US 6,613,634 B2
(45) Date of Patent: Sep. 2, 2003

(54) METHOD OF MANUFACTURING A SEMICONDUCTOR DEVICE USING OBLIQUE ION INJECTION

(75) Inventors: Fumio Ootsuka, Tokorozawa (JP); Katsuhiko Ichinose, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/929,259

(22) Filed: Aug. 15, 2001

(65) Prior Publication Data

US 2002/0024106 A1 Feb. 28, 2002

(30) Foreign Application Priority Data

Aug. 15, 2000 (JP) ....................................... 2000-246505

(51) Int. Cl.[7] ............................................ H01L 21/8234
(52) U.S. Cl. ........................................ 438/275; 438/302
(58) Field of Search ................................ 438/302, 305, 438/275, 279, 301; 257/368, 903, 393; 365/154, 156

(56) References Cited

U.S. PATENT DOCUMENTS 5,372,957 A * 12/1994 Liang et al. ................ 257/344
5,534,449 A * 7/1996 Dennison et al. ........... 438/231
5,668,770 A * 9/1997 Itoh et al. .............. 148/DIG. 9
5,780,910 A 7/1998 Hashimoto et al.
5,880,020 A 3/1999 Mano

FOREIGN PATENT DOCUMENTS

| | | |
|---|---|---|
| JP | 9-36252 | 2/1997 |
| JP | 9-55440 | 2/1997 |
| JP | 9-129753 | 5/1997 |

* cited by examiner

*Primary Examiner*—Long Pham
*Assistant Examiner*—Hoai Pham
(74) *Attorney, Agent, or Firm*—Antonelli, Terry, Stout & Kraus, LLP

(57) ABSTRACT

Upon formation, by oblique ion injection, of a pocket ion region in a p channel type MISFET forming region (n type well) constituting an SRAM, the p channel type MISFET forming region is disposed at a distance from a resist film formed over an n channel type MISFET forming region (p type well), which distance is the product of the thickness H of the resist film and the tangent of an ion injection angle θ. Consequently, an impurity is not injected from one direction in other areas, in spite of the injection from four directions, which makes it possible to suppress fluctuations of the impurity concentration in the pocket ion region.

21 Claims, 31 Drawing Sheets

MC1
MC2
MC3
MC4
Ap
An
G
CT
C

H
Rn2
(4)
PKp1
13
S2
θ
2
5
PRn2
PKp2
3
1
4
PKn2
PKn1
E
E (3)
PKp1
Rn1
13
S1
θ
5
2
PKp2
PRn1
PKn2
PKn1
4
1
3
5
D
D
H

M1
HM1
C2
C1
P1
9a
9b
16
G
10
20
21
22
23
8
13
14
17
18
19
2
3
4
5
1
PKp1
PKp2
PKn1
PKn2
C

METHOD OF MANUFACTURING A SEMICONDUCTOR DEVICE USING OBLIQUE ION INJECTION

The present invention relates to a semiconductor integrated circuit device and a method of manufacturing the same. In particular, the invention pertains to a technique effective when applied to a semiconductor integrated circuit device with an SRAM (Static Random Access Memory) having a memory cell formed of 6 MISFETs (Metal Insulator Semiconductor Field Effect Transistor).

BACKGROUND OF THE INVENTION

As a cache memory for personal computers or work stations, an SRAM whose memory cell is made up of 6 MISFETs has been employed. Such an SRAM is described, for example, in Japanese Patent Application Laid-Open No. Hei 9(1997)-1129753, Japanese Patent Application Laid-Open No. Hei 9(1997)-55440, which is a Japanese application corresponding to U.S. Pat. No. 5,880,020, or Japanese Patent Application Laid-Open No. Hei 9(1997)-36252, which is a Japanese application corresponding to U.S. Pat. No. 5,780, 910.

Attempts to miniaturize an MISFET have met with the problem of lowering of the withstand voltage between source and drain due to short channel effects. More specifically, when the channel length (width of a gate electrode) becomes short with miniaturization of the MISFET, depletion layers extending from the source and drain, respectively, are linked inevitably. Under such a state, the drain field exerts an influence on the source and decreases the diffusion potential in the vicinity of the source so that a current flows between the source and drain even without a channel (punch through phenomenon). Once this punch through phenomenon occurs, the drain current undergoes a drastic increase with an increase in the drain voltage, thereby preventing the flow of saturation current.

With a view toward overcoming the above-described problem, a source and drain structure has been proposed which adopts an LDD structure (Lightly doped Drain) formed of a low-concentration semiconductor region and a high-concentration semiconductor region. In addition, by forming, below the source and drain, a region (which is called a pocket ion region or halo region) made of an impurity having a conductivity type opposite to that of the impurity of the source and drain, widening of each of the depletion layers extending from the source and drain is suppressed, whereby the appearance of a punch through phenomenon is prevented.

SUMMARY OF THE INVENTION

It is effective to form this pocket ion region not only below the source and drain, but also in the channel region. Since a gate electrode lies over the channel region, the pocket ion region must be formed by an oblique ion injection method.

An SRAM has six MISFETs in total, as described above, that is, two n channel type driver MISFETs, two n channel type transfer MISFETs and two p channel type load MISFETs. Of these, two n channel type driver MISFETs and two p channel type load MISFETs constitute a pair of CMOS inverters.

Upon ion injection for forming the above-described pocket ion region (which will hereinafter be called "pocket ion injection"), it is necessary to carry out pocket ion injection to the p channel type load MISFET while covering the n channel type driver MISFET and n channel type transfer MISFET with a resist film, thereby preventing the injection into the n channel type MISFET of the pocket ions (n type) for the p channel type MISFET. On the contrary, upon pocket ion injection to the n channel type driver MISFET and the n channel type transfer MISFET, it is necessary to cover the p channel type load MISFET with a resist film, thereby preventing the injection into the p channel type MISFET of the pocket ions (p type) for the n channel type MISFET.

In a region wherein the p channel type MISFET and n channel type MISFET are close to each other, pocket ions cannot be injected to a region shielded by a resist film. As will be described later in detail, an active region in which the p channel type MISFET is to be formed is disposed so that its distance S from the end portion of the resist film over the n channel type MISFET would be greater than the product of the thickness H of the resist film and the tangent of an ion injection angle θ ($S>H\tan\theta$). An active region in which the n channel type MISFET is to be formed is disposed similarly so that its distance S from the end portion of the resist film over the p channel type MISFET would be greater than the product of the thickness H of the resist film and the tangent of an ion injection angle θ ($S>H\tan\theta$).

The thickness H of the resist film or ion injection angle θ are almost specified to satisfy the exposure accuracy of the resist material or characteristics of an MISFET, which inevitably defines the distance S is between the end portion of the resist film and the active region. It is therefore difficult to decrease the cell area.

Moreover, even if the active region is spaced apart from the end portion of the resist film by the above-described distance S, when the resist film is formed at a position deviated from a desired position that is owing to mask misregistration, a region not permitting pocket ion injection appears, resulting in fluctuations of the pocket ion concentration, thereby causing fluctuations in the threshold voltage Vth of the MISFET constituting the SRAM.

An object of the present invention is therefore to provide a technique for reducing the area of a semiconductor integrated circuit device, for example, an SRAM.

Another object of the present invention is to provide a technique for suppressing variations in the threshold voltage Vth of an MISFET constituting a semiconductor integrated circuit device, for example, an SRAM, thereby improving its characteristics.

The above-described objects and novel features of the present invention will be apparent from the description herein and the accompanying drawings.

Among the aspects and features of the invention disclosed by the present application, typical ones will next be summarized briefly.

(1) In accordance with the present invention, the impurity concentration of the second pocket ion region of each of the n-channel type MISFET and p-channel type MISFET for a memory cell is made lower than that of the second pocket ion region of the n-channel type MISFET and p-channel type MISFET for a peripheral circuit.

(2) The impurity concentration of the second pocket ion region of the n-channel type MISFET and p-channel type MISFET formed in a first region and a second region spaced apart therefrom by a first distance D1 is made lower than that of the second pocket ion region of the n-channel type MISFET and p-channel type MISFET formed in a third region and a fourth region spaced apart therefrom by a second distance D2. By preventing injection of impurities from one direction among impurities injected from four directions, the impurity concentration in the second pocket ion region of the n-channel type MISFET and p-channel type MISFET formed in an MISFET for a memory cell or a region adjacent thereto can be made low and uniform, thereby preventing fluctuations in the threshold voltage Vth. In addition, area reduction can be attained.

(3) Upon forming a pocket ion region in the first region by oblique ion implantation, oblique ion implantation is conducted while disposing the first region within a distance Si, which is the product of the thickness H of the resist film and the tangent of an ion implantation angle θ, from the end portion of the resist film formed over the second region, which prevents injection of impurities from one direction among impurities injected from four directions, thereby making it possible to prevent fluctuations in the threshold voltage Vth. In addition, a reduction in the area can be attained.

DETAILED DESCRIPTION OF THE DRAWINGS

Figure 13A:
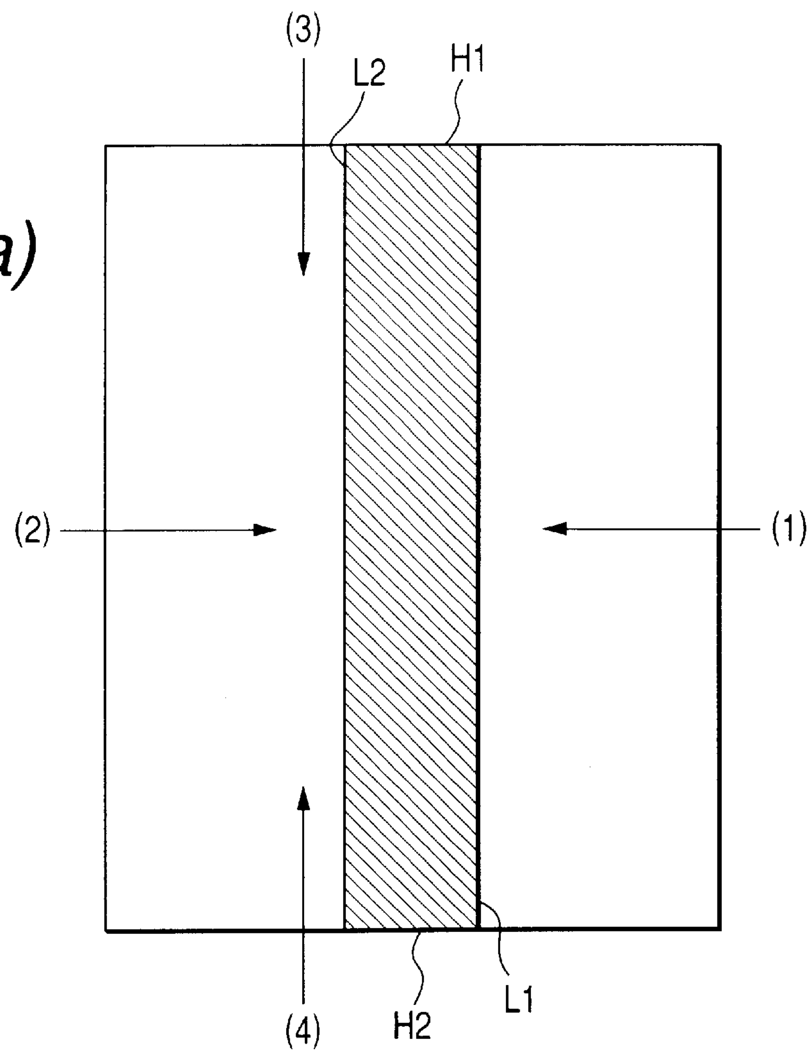
Figure 13B:
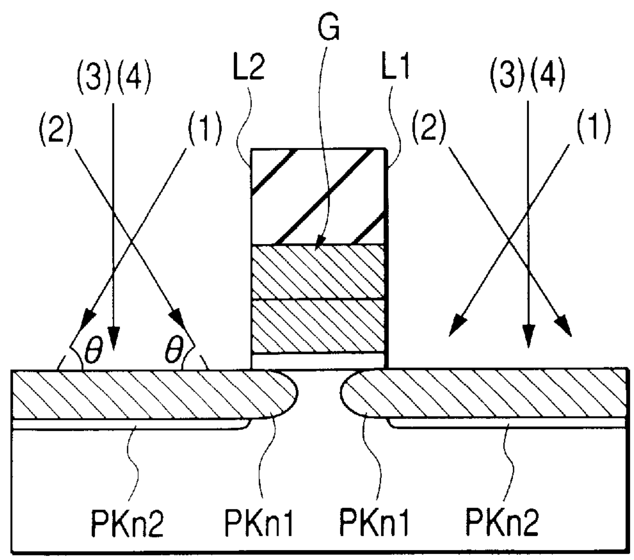
Figure 14:
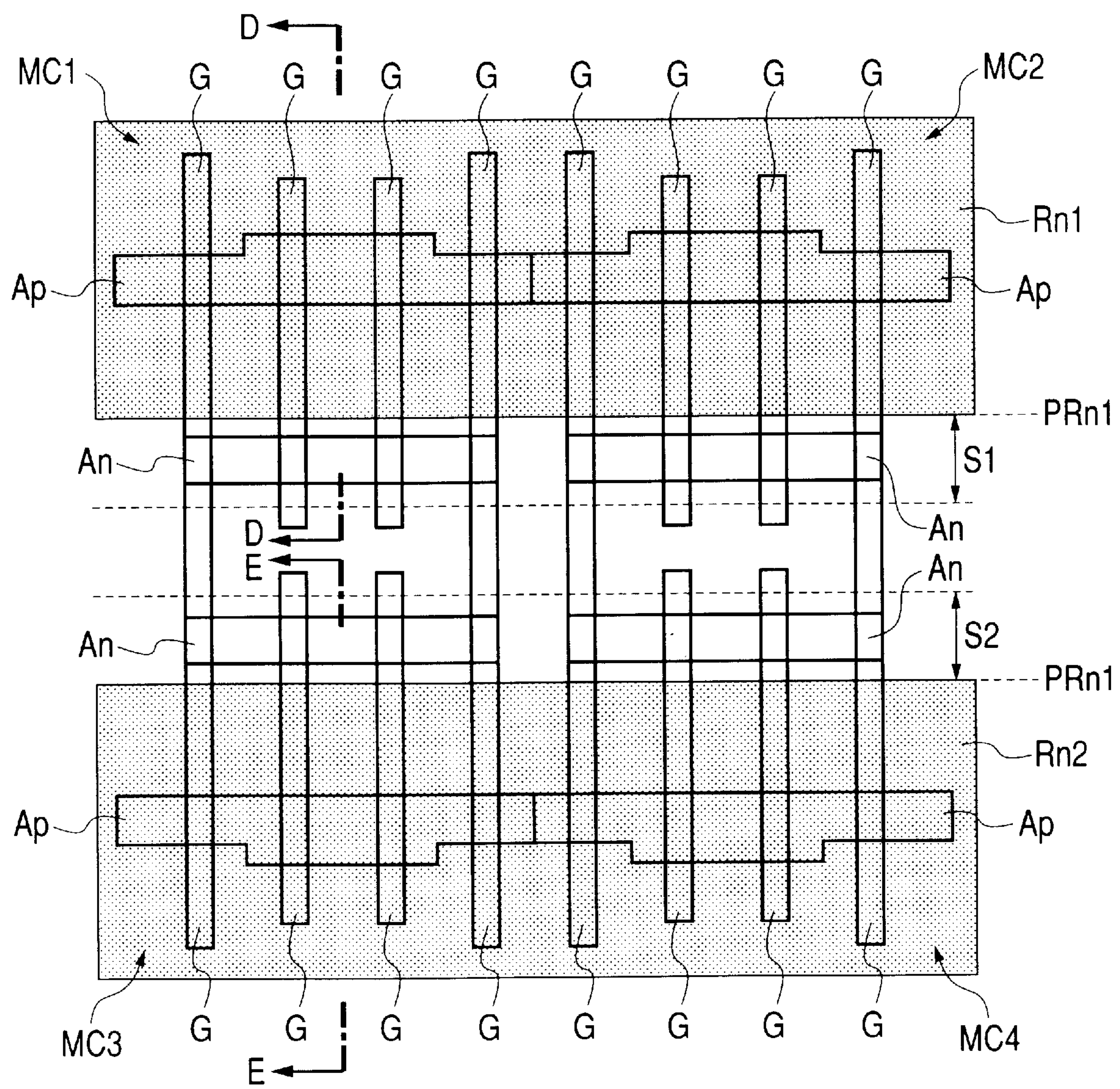
Figures 15A, 15B:
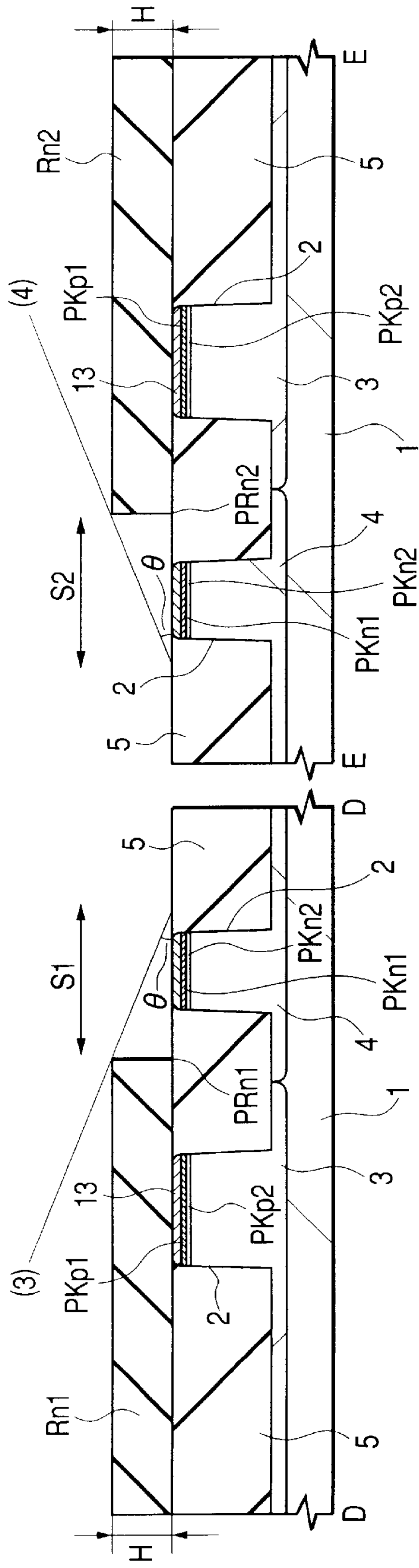
Figure 16A:
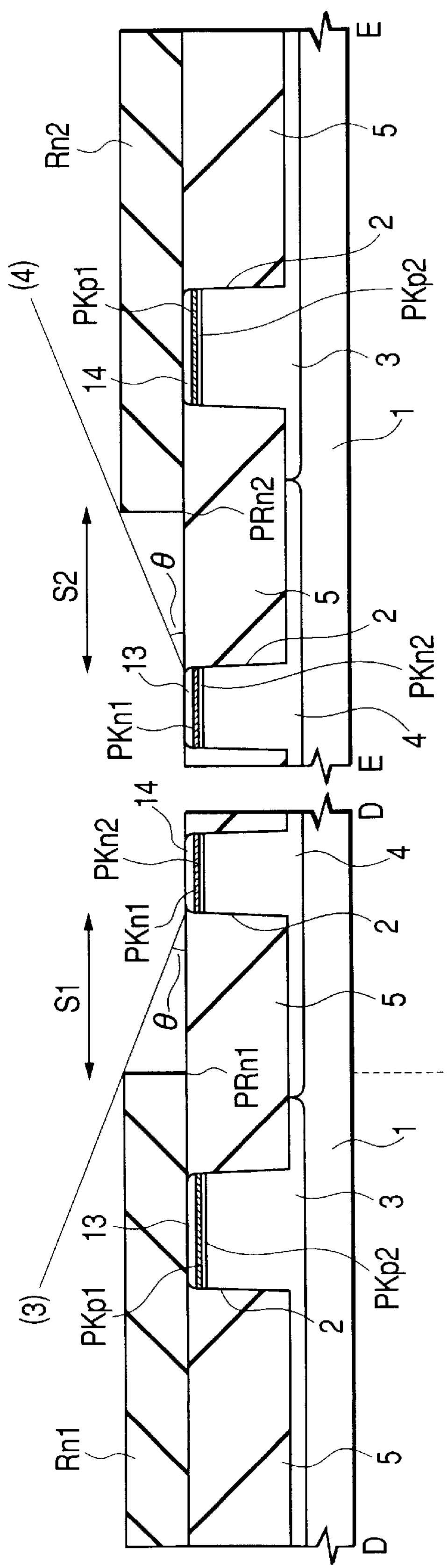
Figure 16B:
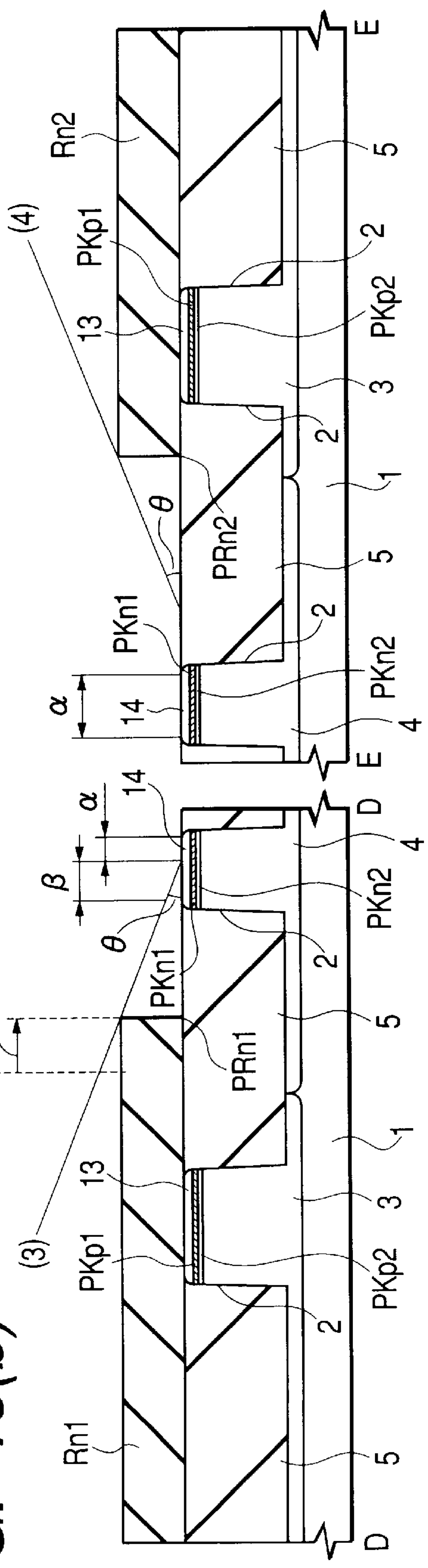
Figure 17:
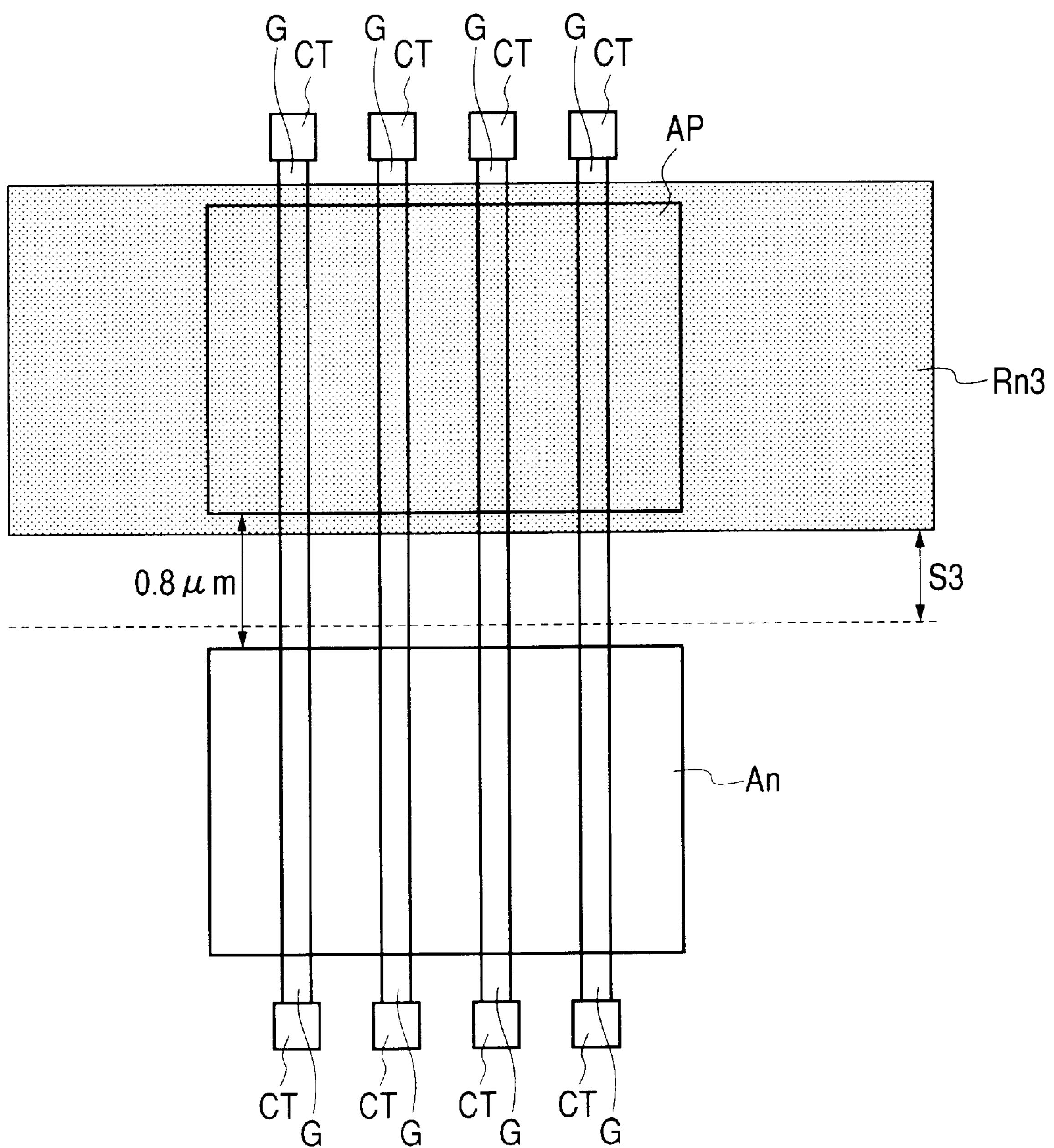
Figure 18:
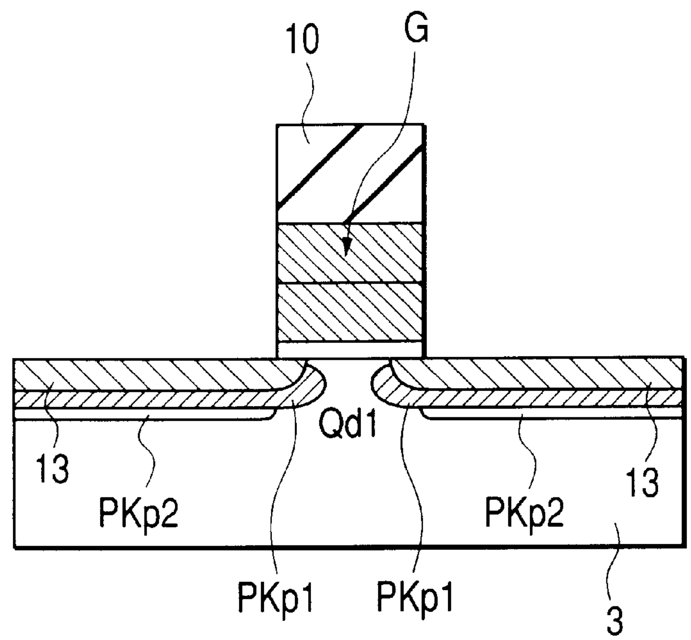
Figure 19:
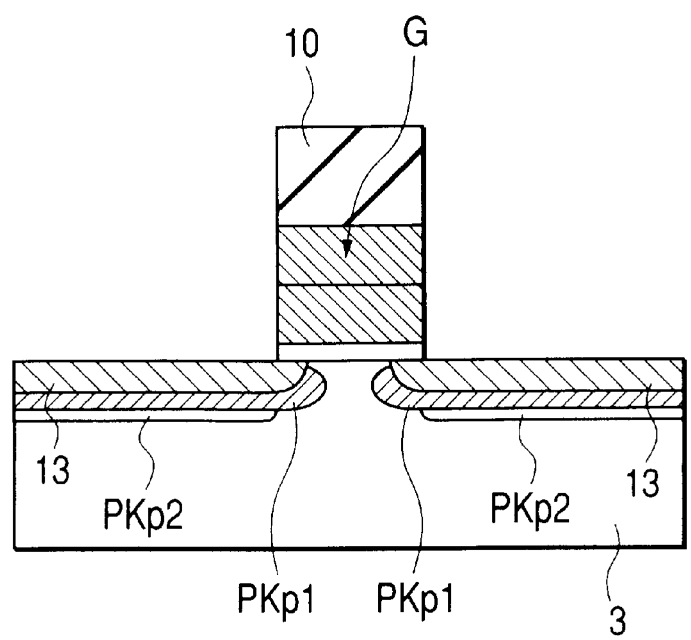
Figure 20:
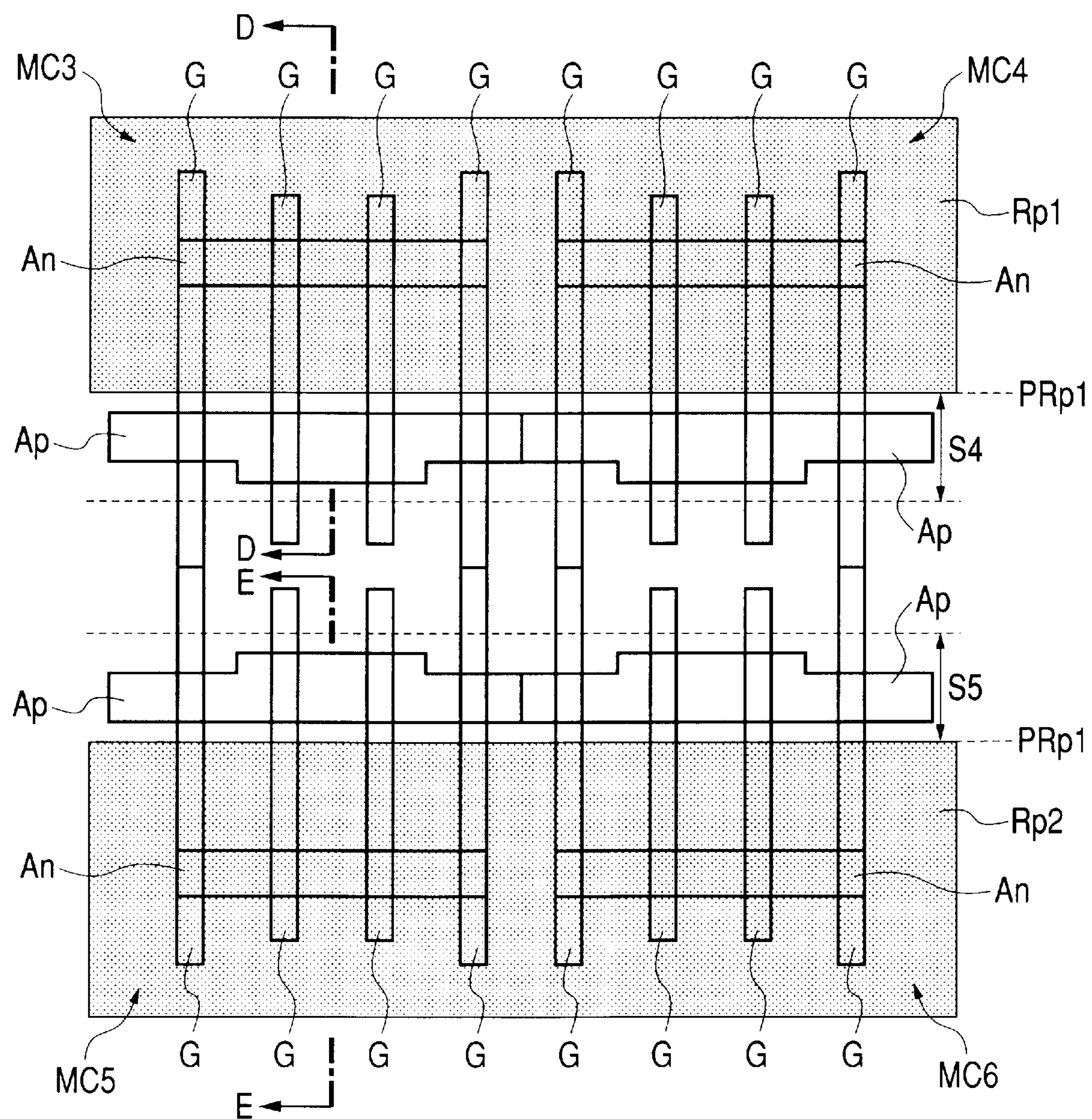
Figure 21:
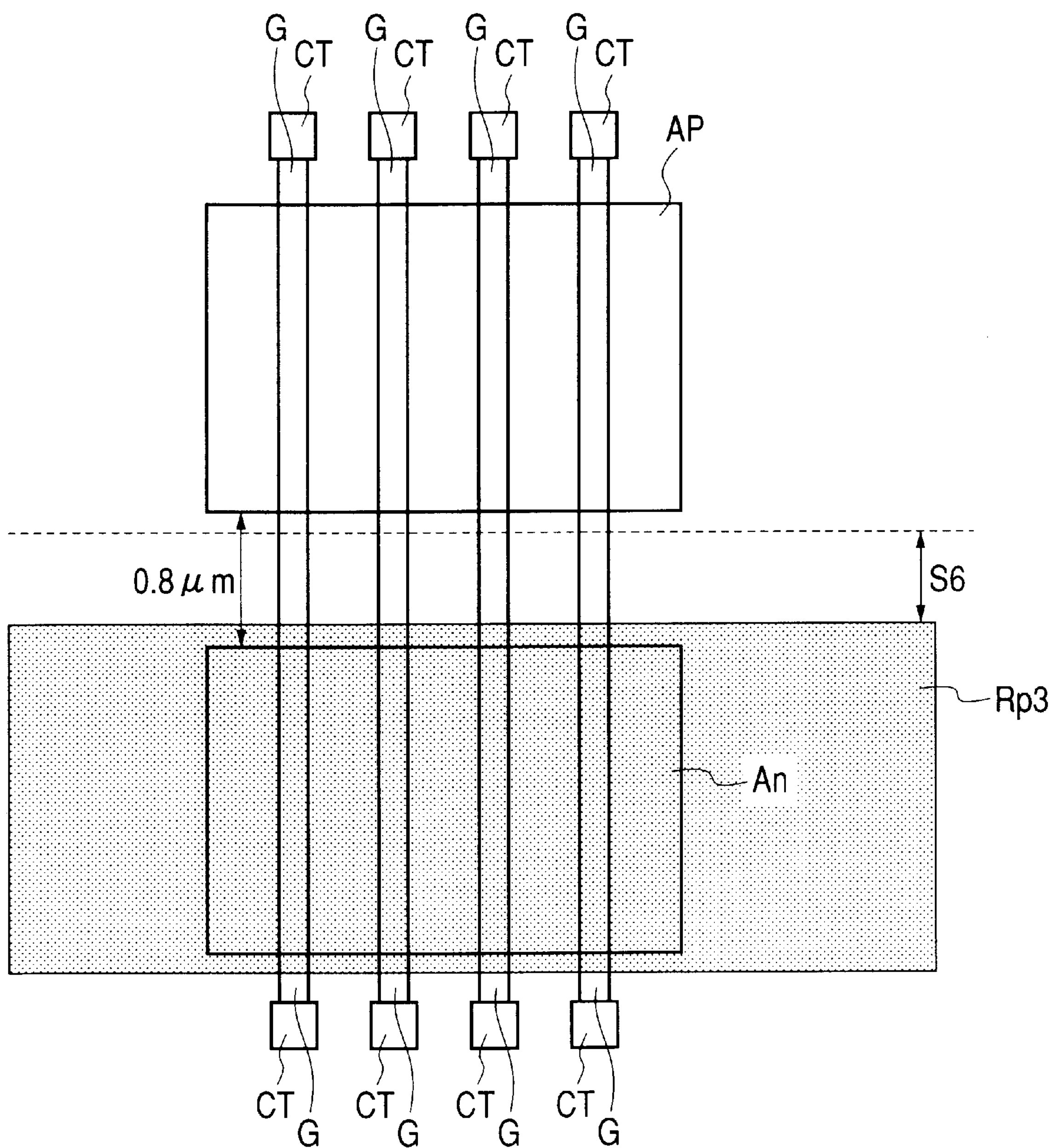
Figure 22:
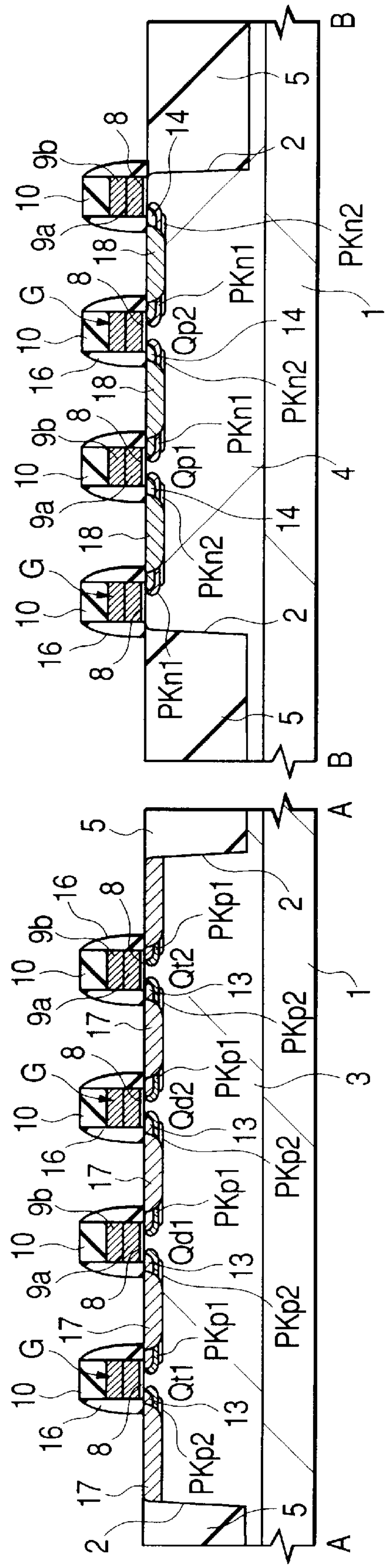
Figure 23:
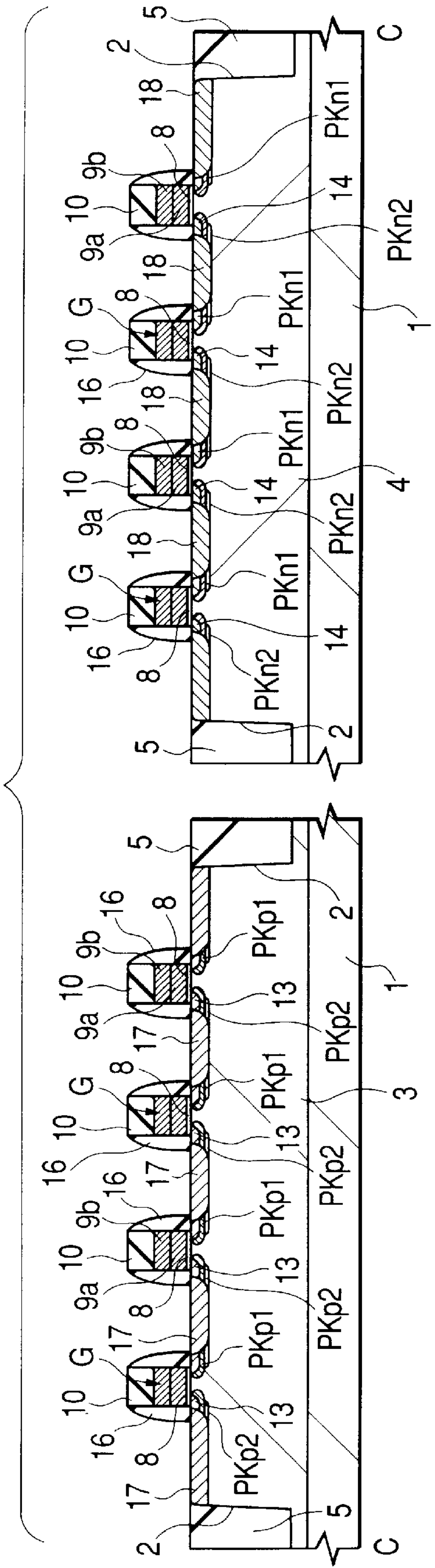
Figure 24:
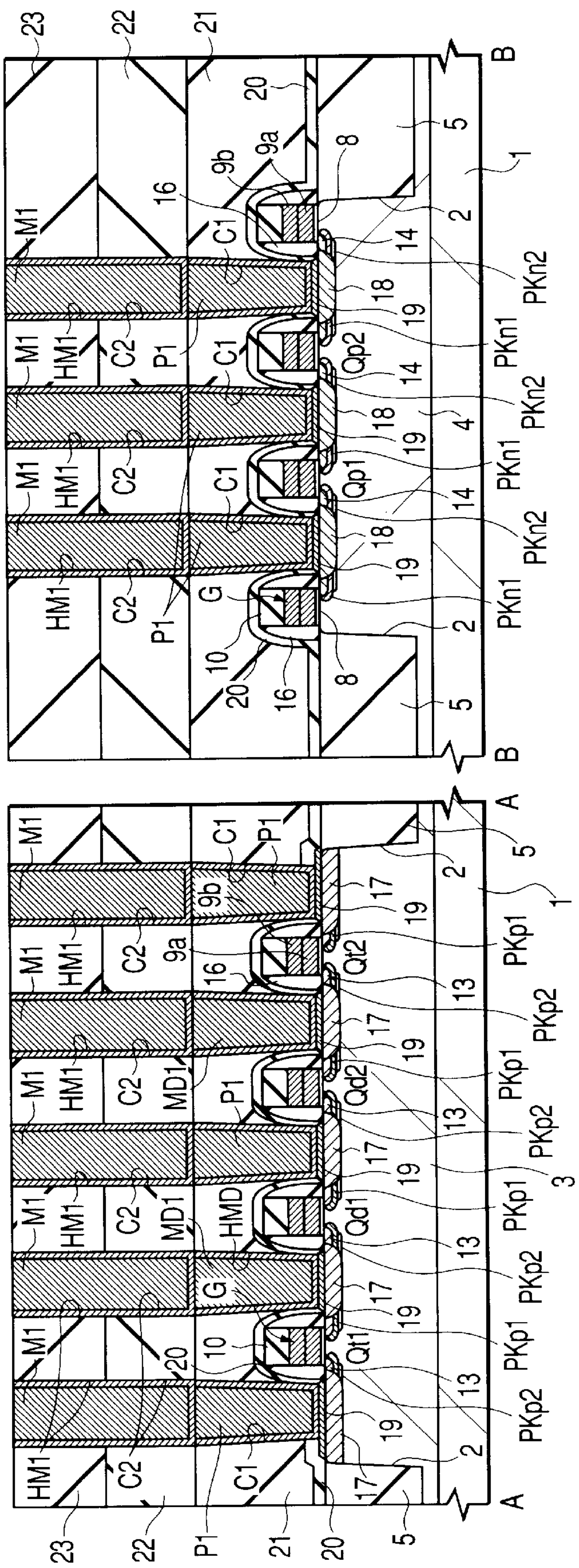
Figure 25:
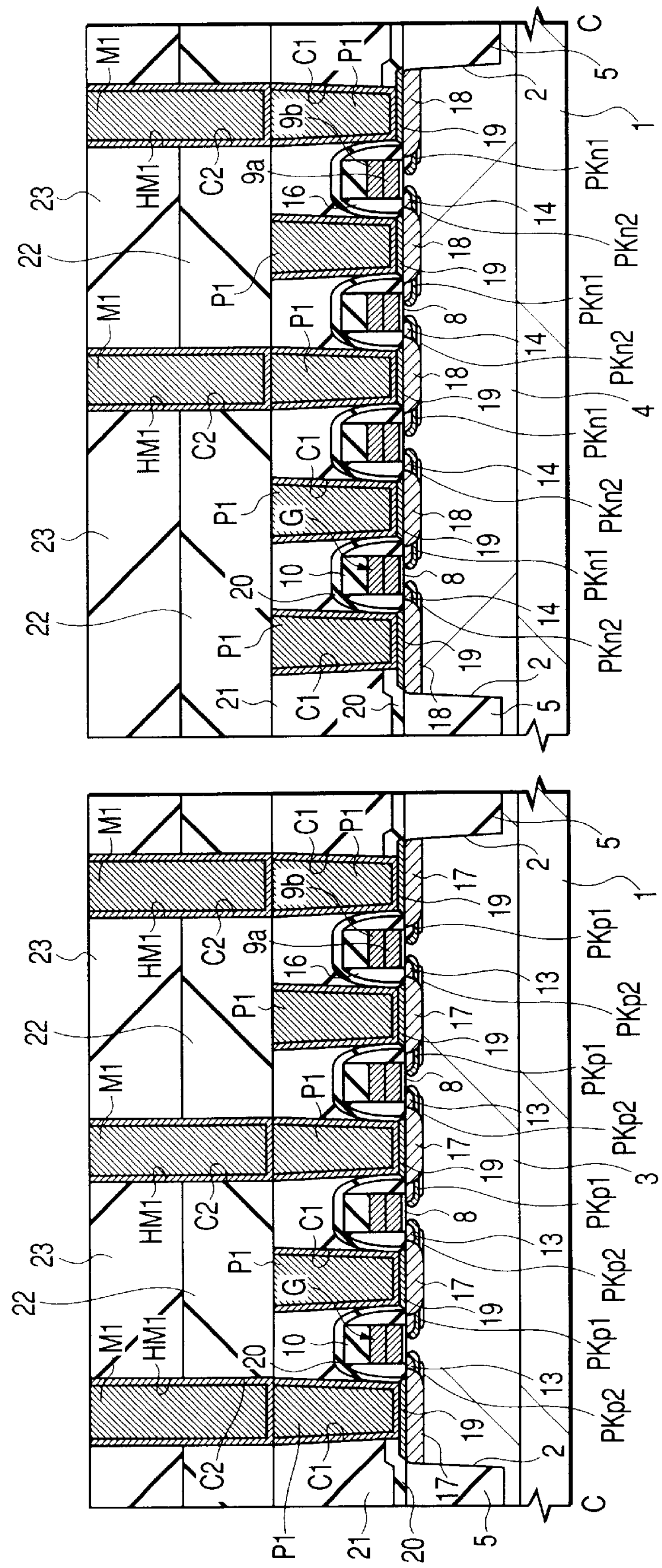
Figure 26:
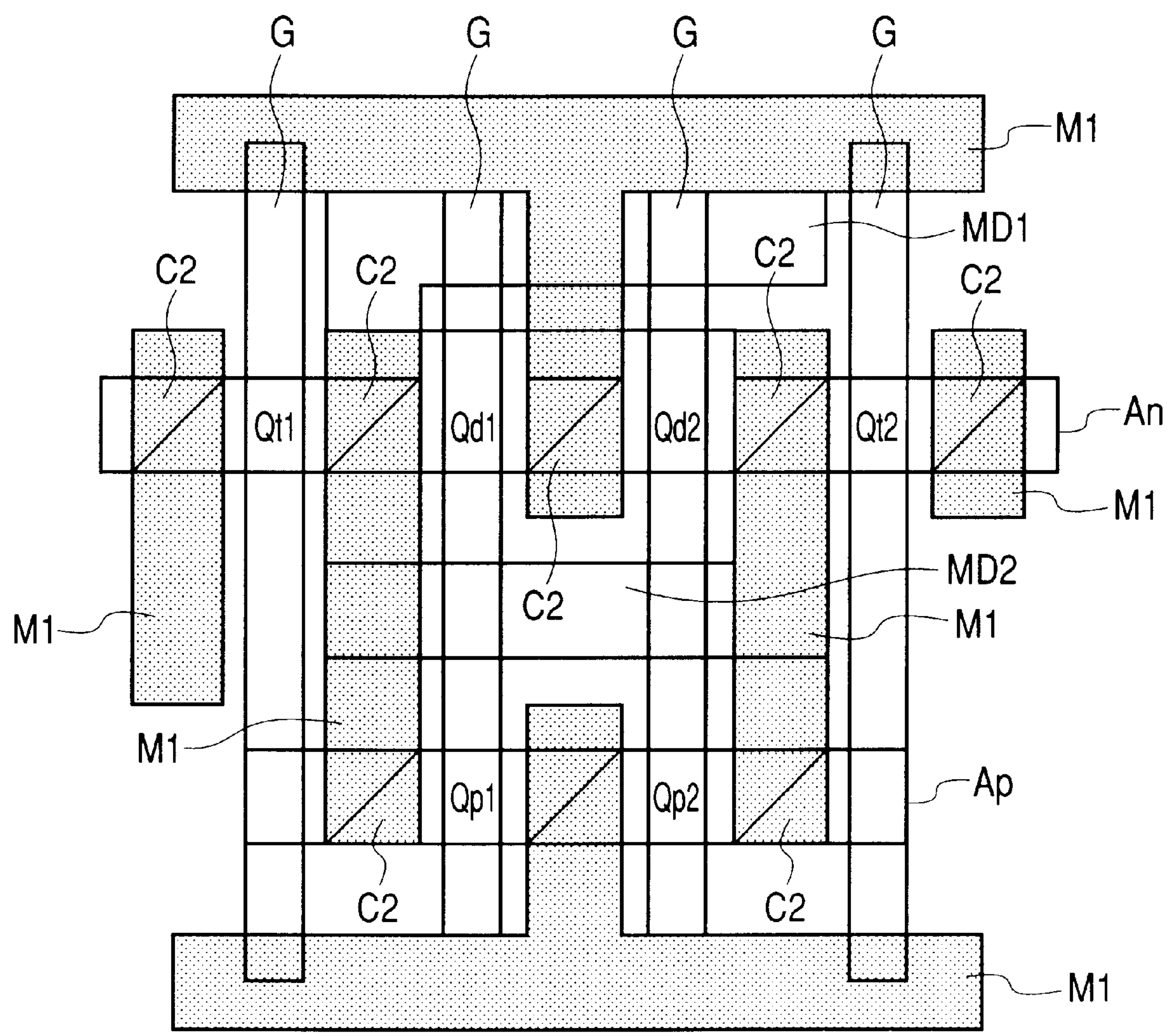
Figure 27:
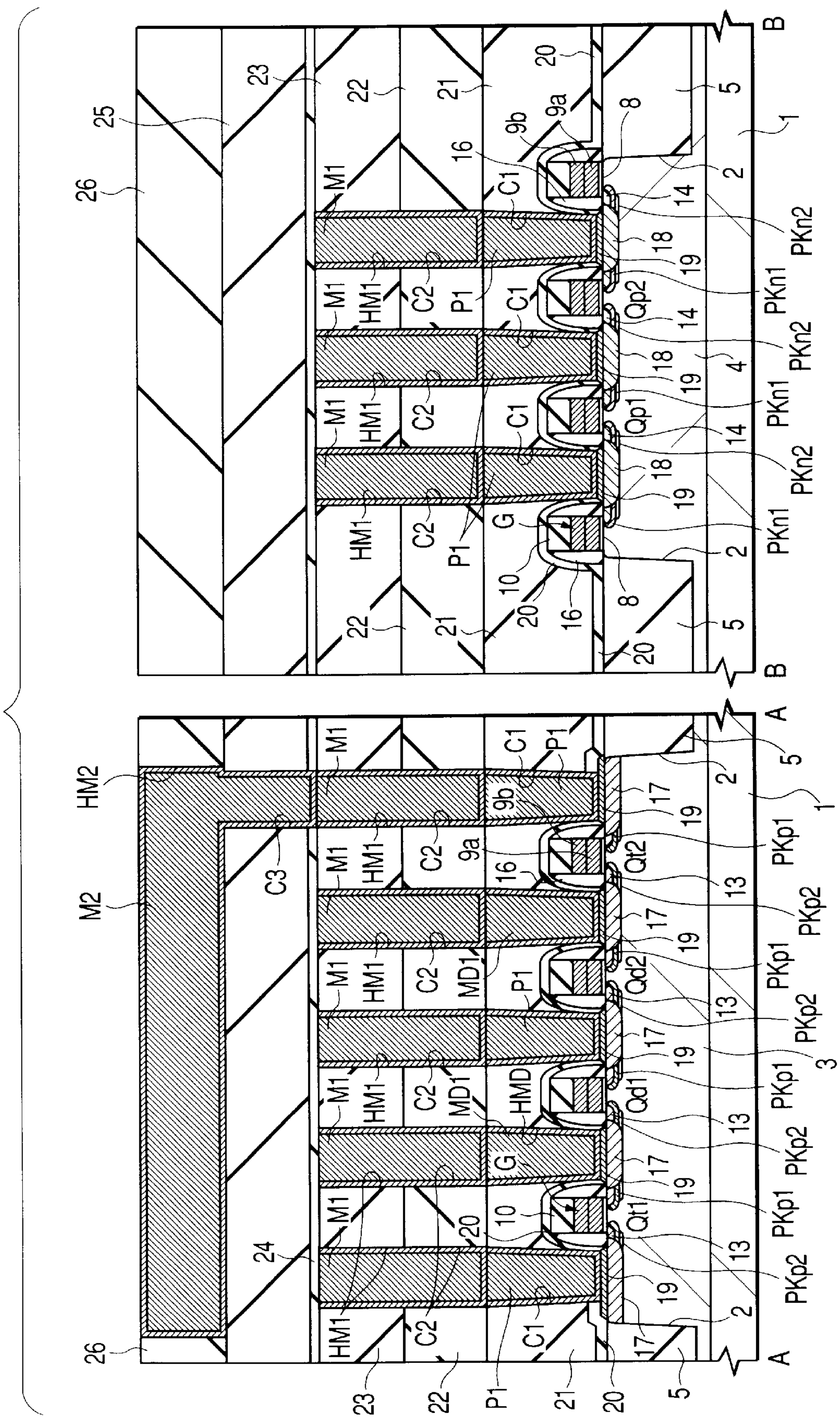
Figure 28:
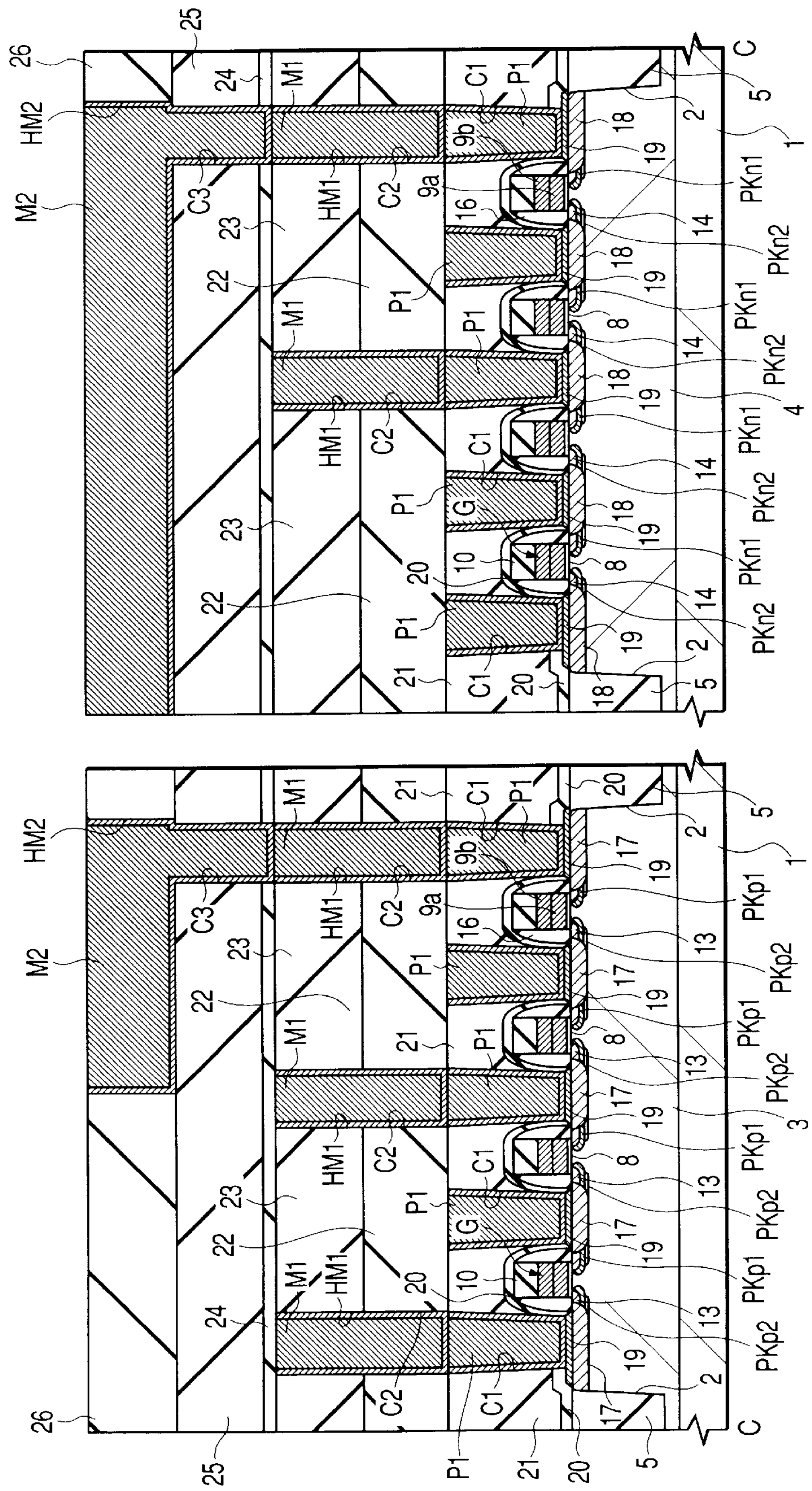
Figure 29:
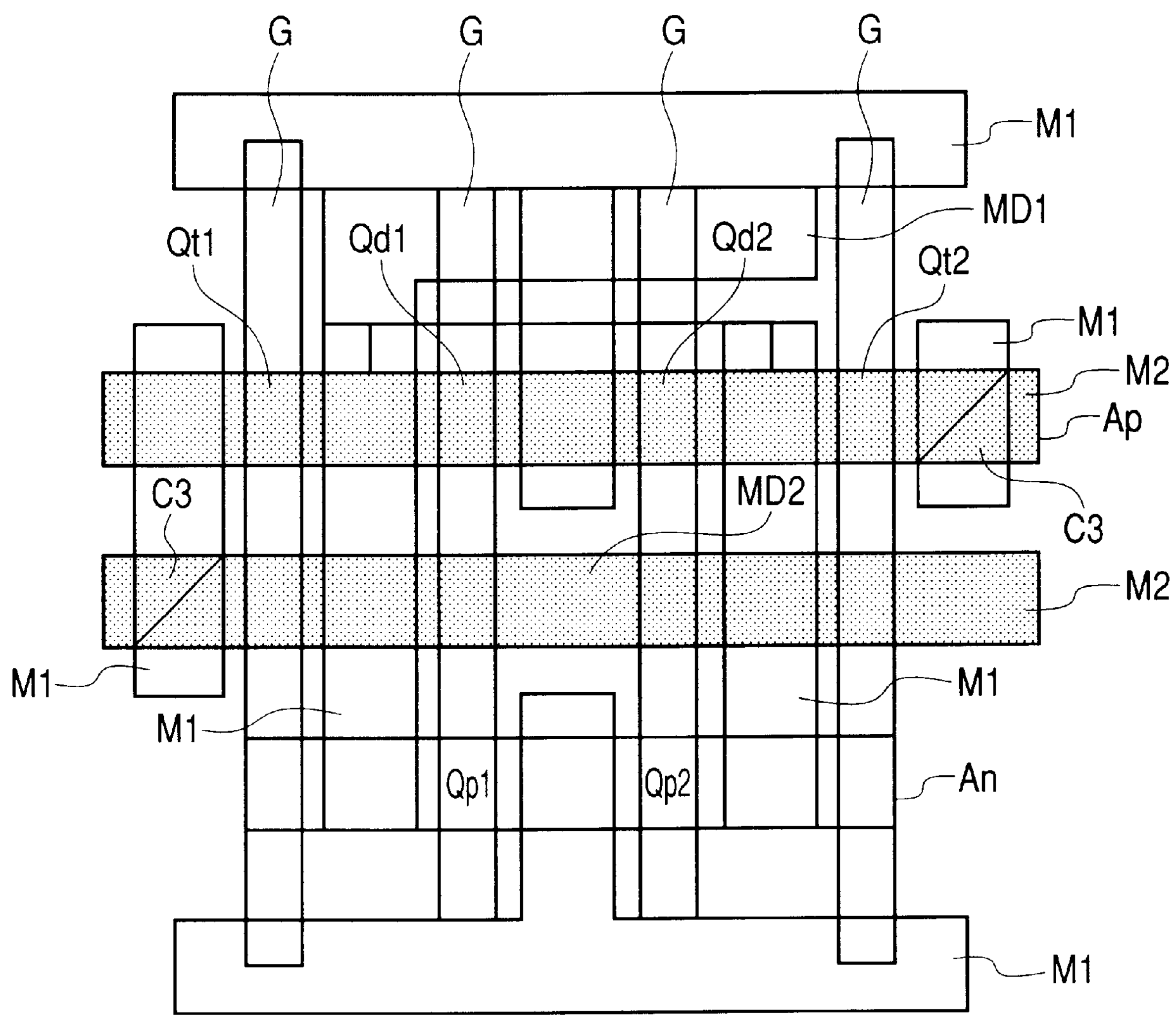
Figure 30:
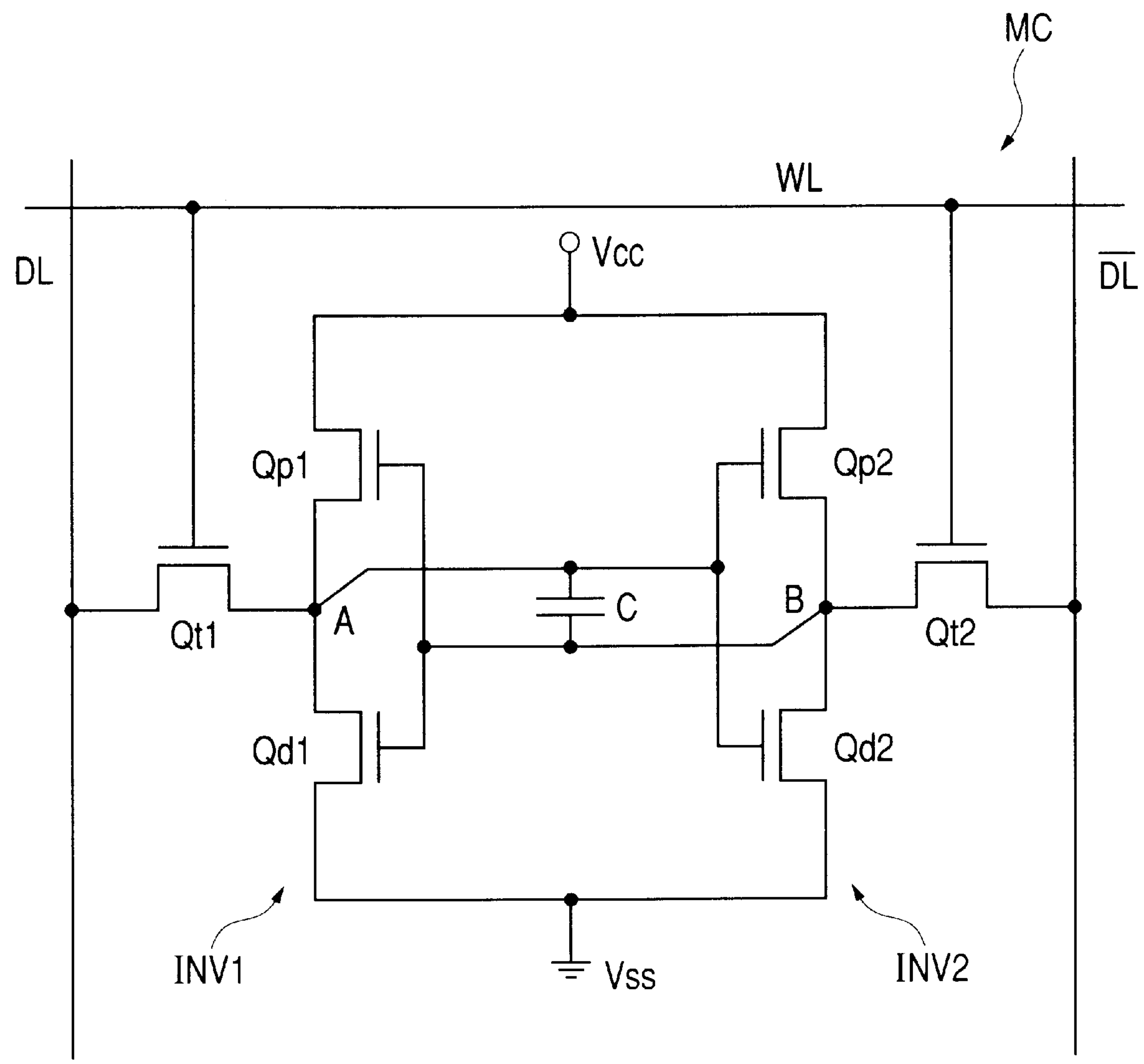
Figure 31:
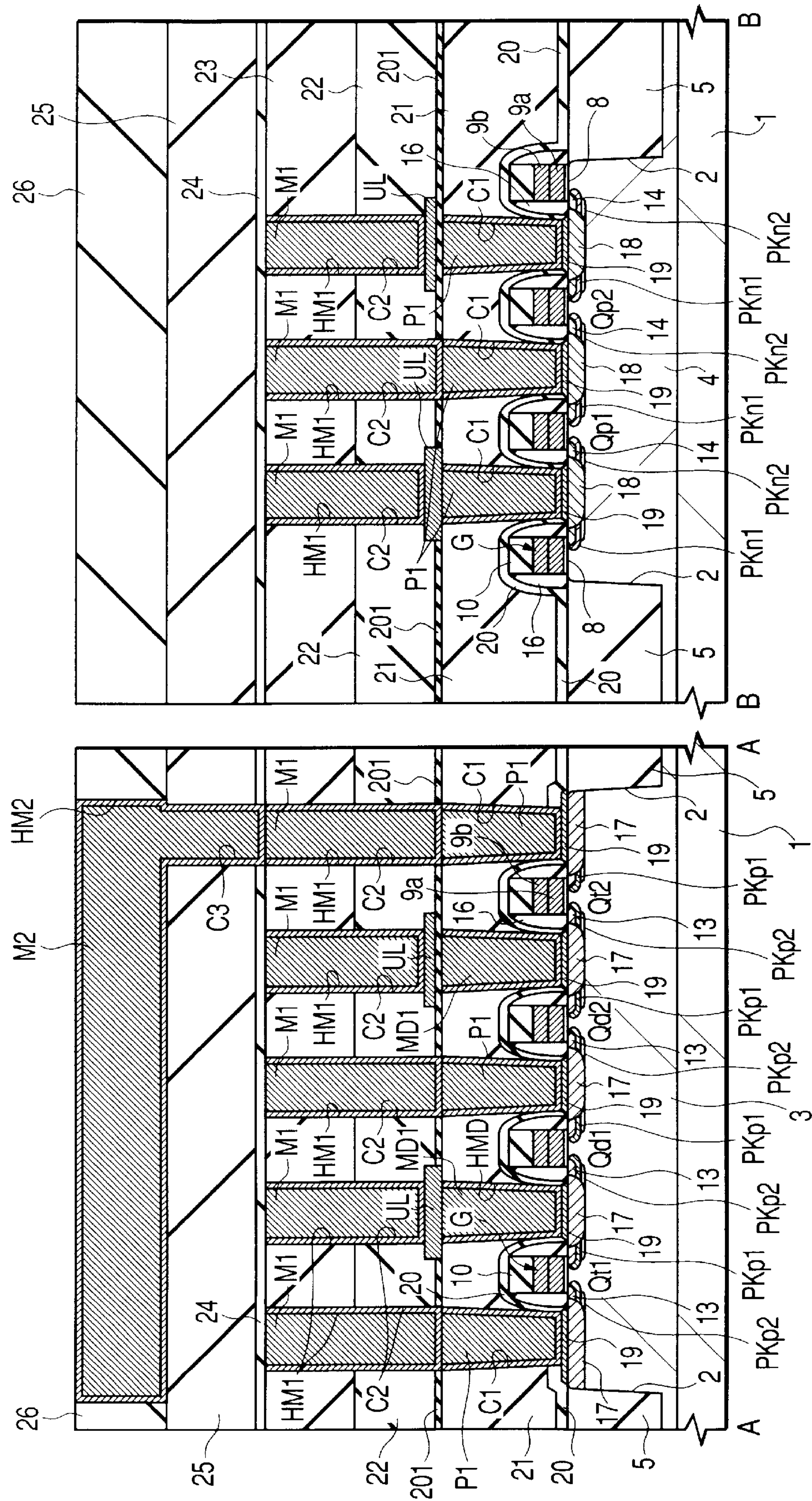
Figure 32:
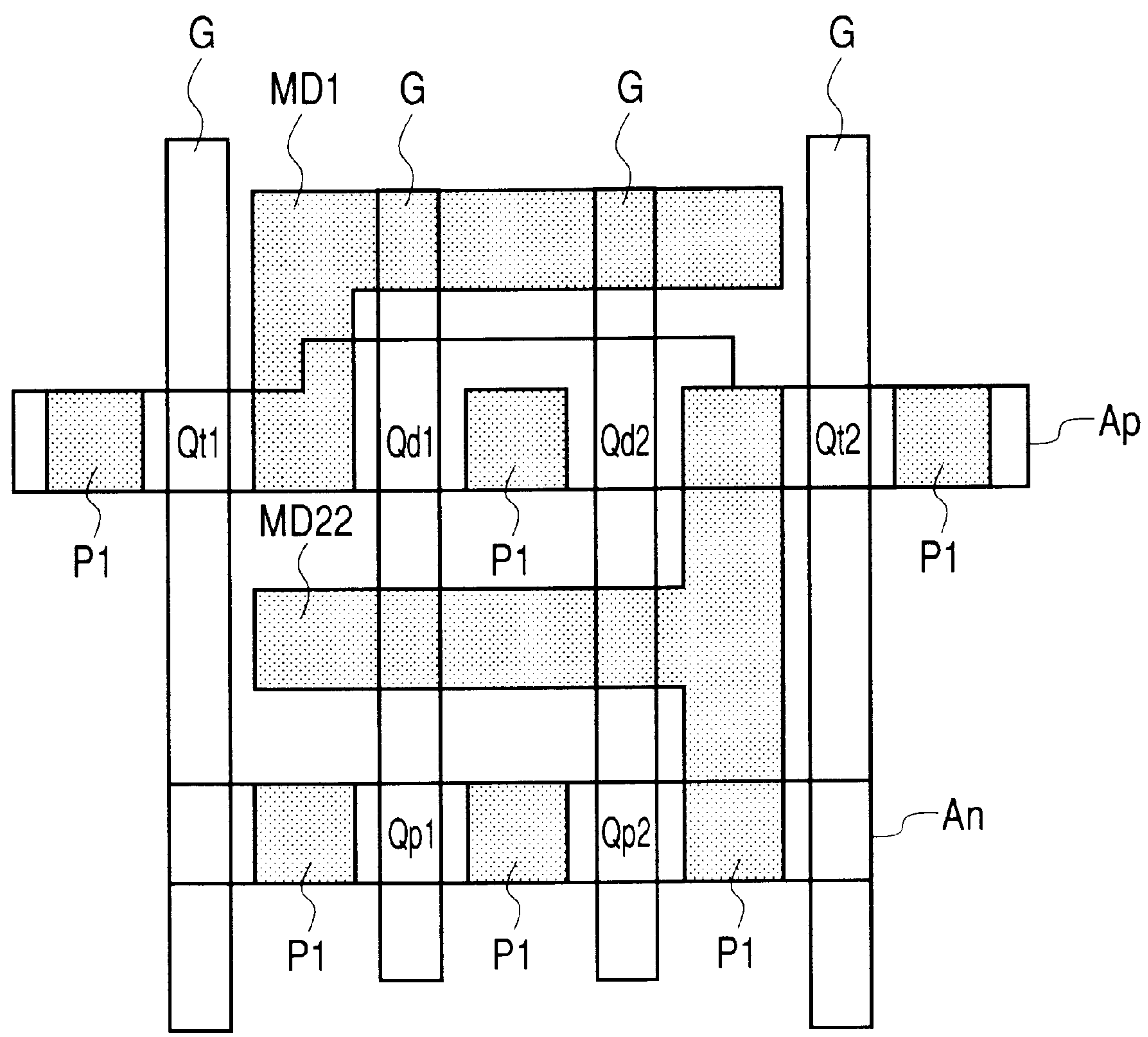
Figure 33:
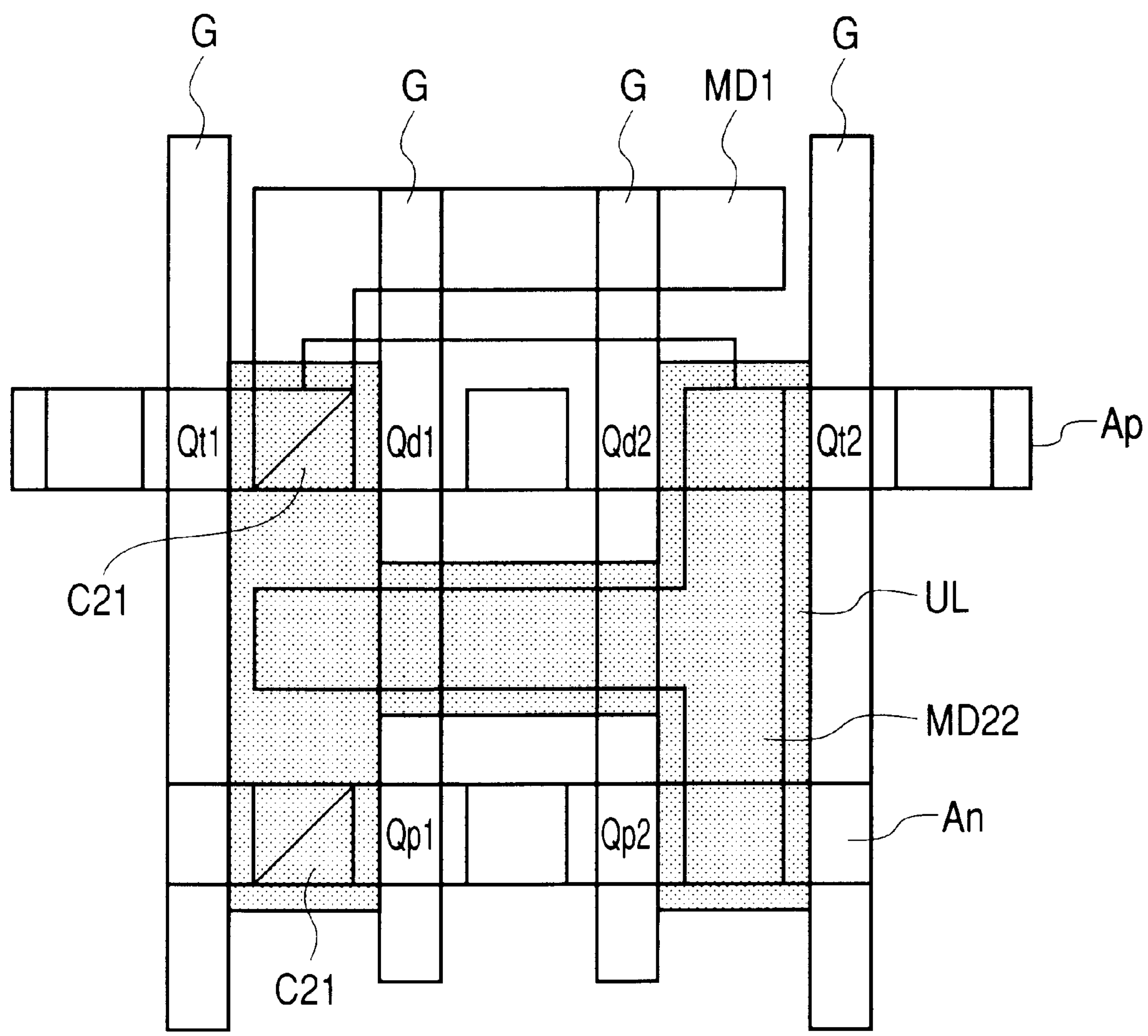
Figure 34:
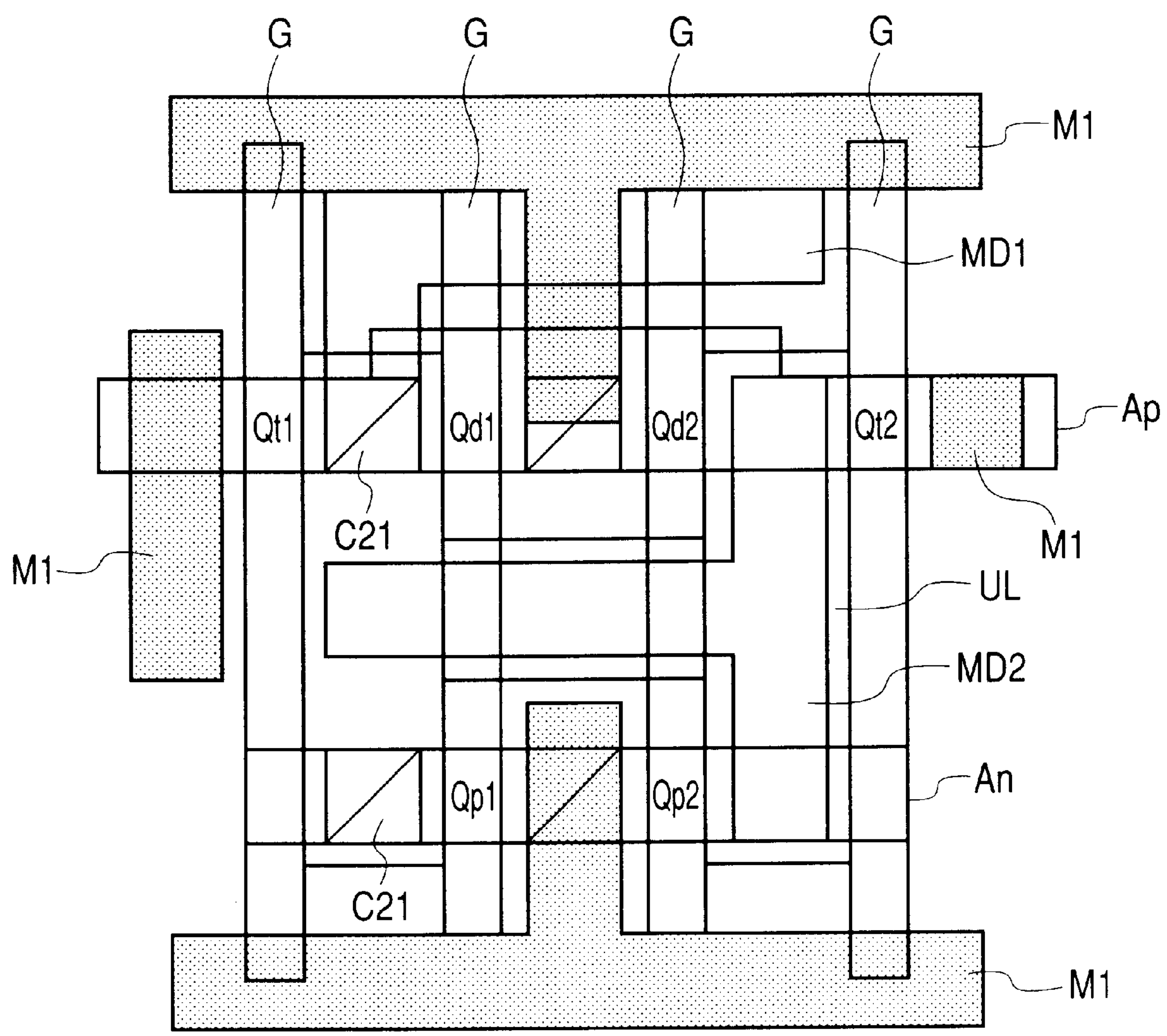
Figure 35:
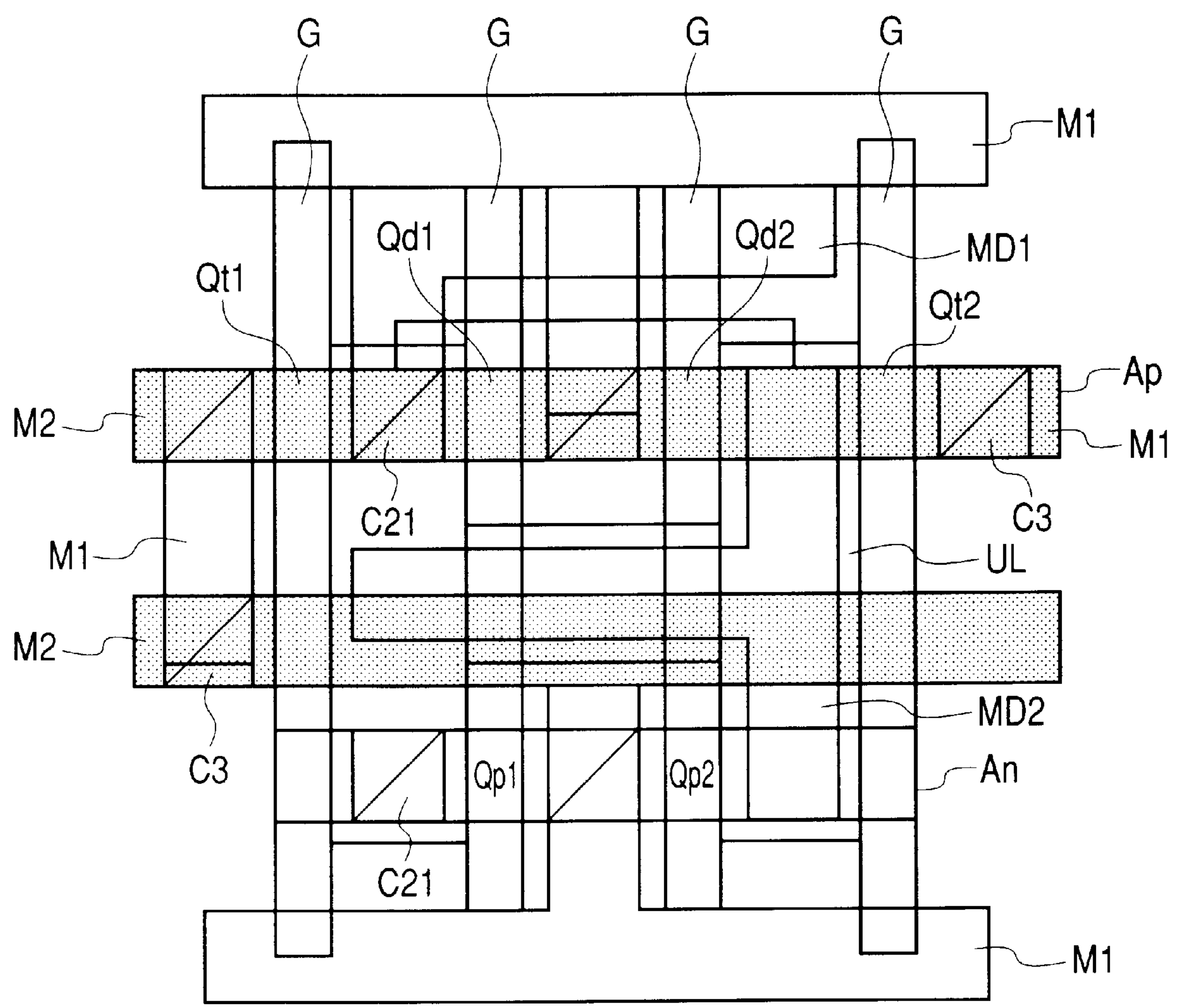
Figure 36:
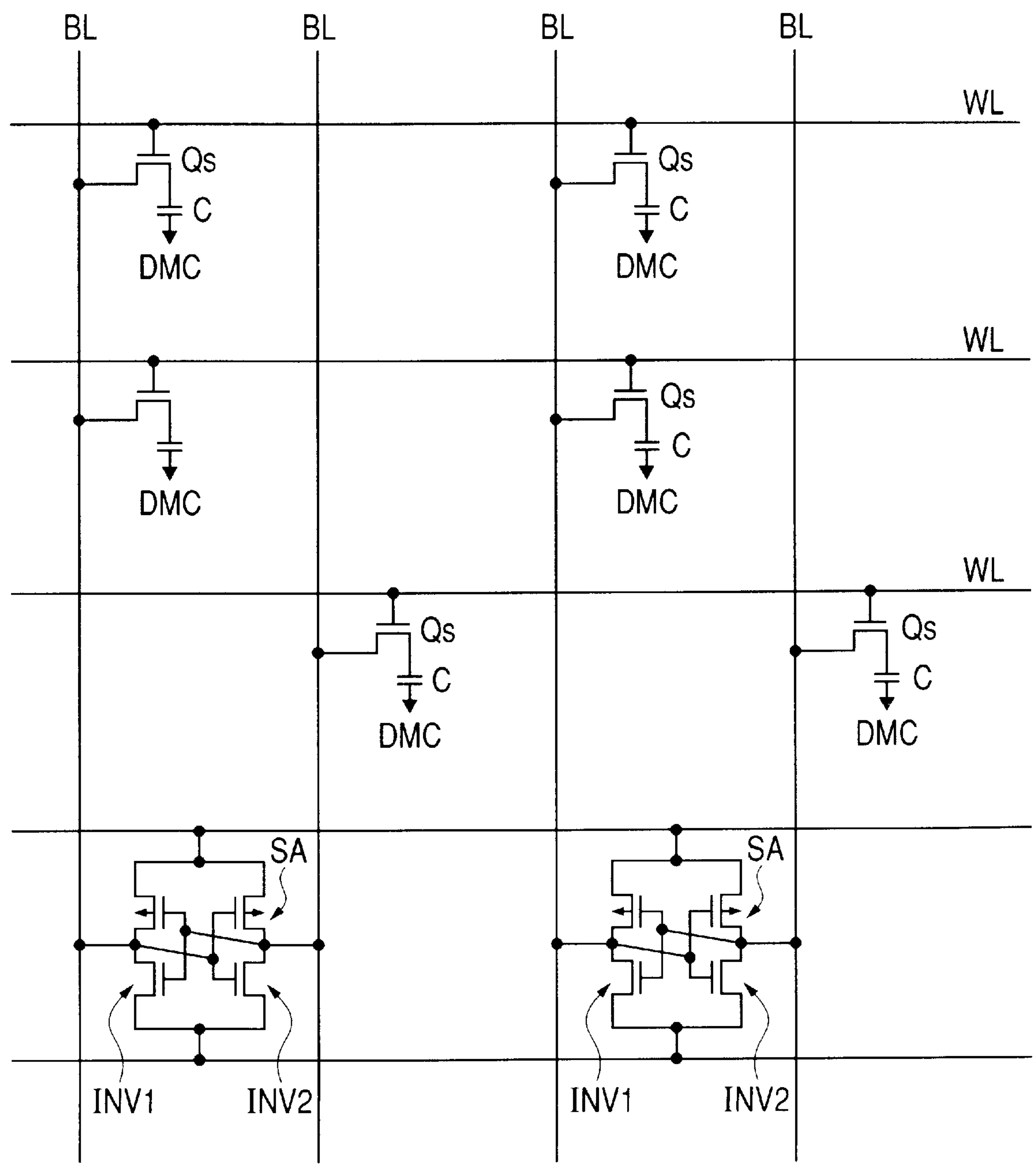

FIGS. 13(*a*) and 13(*b*) are fragmentary cross-sectional views of the semiconductor substrate illustrating a step in the method of manufacture of the SRAM memory cell forming region and peripheral circuit region according to Embodiment 1 of the present invention;

FIG. 14 is a fragmentary diagrammatic plan view of the semiconductor substrate illustrating the SRAM memory cell forming region according to Embodiment 1 of the present invention;

FIGS. 15(*a*) and 15(*b*) are fragmentary cross-sectional views of the semiconductor substrate illustrating a step in the method of manufacture of the SRAM memory cell forming region according to Embodiment 1 of the present invention;

FIGS. 16(*a*) and 16(*b*) are fragmentary cross-sectional views of the semiconductor substrate which illustrate the advantage of the present invention;

FIG. 17 is a fragmentary diagrammatic plan view of the semiconductor substrate illustrating the SRAM peripheral circuit forming region according to Embodiment 1 of the present invention;

FIG. 18 is a fragmentary cross-sectional view of the semiconductor substrate illustrating a step in the method of manufacture of the SRAM memory cell forming region according to Embodiment 1 of the present invention;

FIG. 19 is a fragmentary cross-sectional view of the semiconductor substrate illustrating a step in the method of manufacture of the SRAM peripheral circuit forming region according to Embodiment 1 of the present invention;

FIG. 20 is a fragmentary diagrammatic plan view of the semiconductor substrate illustrating the SRAM memory cell forming region according to Embodiment 1 of the present invention;

FIG. 21 is a fragmentary diagrammatic plan view of the semiconductor substrate illustrating the SRAM peripheral circuit forming region according to Embodiment 1 of the present invention;

FIG. 22 is a fragmentary cross-sectional view of the semiconductor substrate illustrating a step in the method of manufacture of the SRAM memory cell forming region according to Embodiment 1 of the present invention;

FIG. 23 is a fragmentary cross-sectional view of the semiconductor substrate illustrating a step in the method of manufacture of the SRAM is peripheral circuit forming region according to Embodiment 1 of the present invention;

FIG. 24 is a fragmentary cross-sectional view of the semiconductor substrate illustrating a step in the method of manufacture of the SRAM memory cell forming region according to Embodiment 1 of the present invention;

FIG. 25 is a fragmentary cross-sectional view of the semiconductor substrate illustrating a step in the method of manufacture of the SRAM peripheral circuit forming region according to Embodiment 1 of the present invention;

FIG. 26 is a fragmentary diagrammatic plan view of the semiconductor substrate illustrating the SRAM memory cell forming region according to Embodiment 1 of the present invention;

FIG. 27 is a fragmentary cross-sectional view of the semiconductor substrate illustrating a step in the method of manufacture of the SRAM memory cell forming region according to Embodiment 1 of the present invention;

FIG. 28 is a fragmentary cross-sectional view of the semiconductor substrate illustrating a step in the method of manufacture of the SRAM peripheral circuit forming region according to Embodiment 1 of the present invention;

FIG. 29 is a fragmentary diagrammatic plan view of the semiconductor substrate illustrating the SRAM memory cell forming region according to Embodiment 1 of the present invention;

FIG. 30 is an equivalent circuit diagram illustrating the memory cell of an SRAM according to Embodiment 2 of the present invention;

FIG. 31 is a fragmentary cross-sectional view of a semiconductor substrate illustrating the memory cell forming region of the SRAM according to Embodiment 2 of the present invention;

FIG. 32 is a fragmentary diagrammatic plan view of the semiconductor substrate illustrating the memory cell forming region of the SRAM according to Embodiment 2 of the present invention;

FIG. 33 is a fragmentary diagrammatic plan view of the semiconductor substrate illustrating the memory cell forming region of the SRAM according to Embodiment 2 of the present invention;

FIG. 34 is a fragmentary diagrammatic plan view of the semiconductor substrate illustrating the memory cell forming region of the SRAM according to Embodiment 2 of the present invention;

FIG. 35 is a fragmentary diagrammatic plan view of the semiconductor substrate illustrating the memory cell forming region of the SRAM according to Embodiment 2 of the present invention; and FIG. 36 is a circuit diagram illustrating sense amplifying within a DRAM memory cell according to another embodiment of the present invention.

DETAILED DESCRIPTION OF THE INVENTION

Embodiment 1

Figure 1:
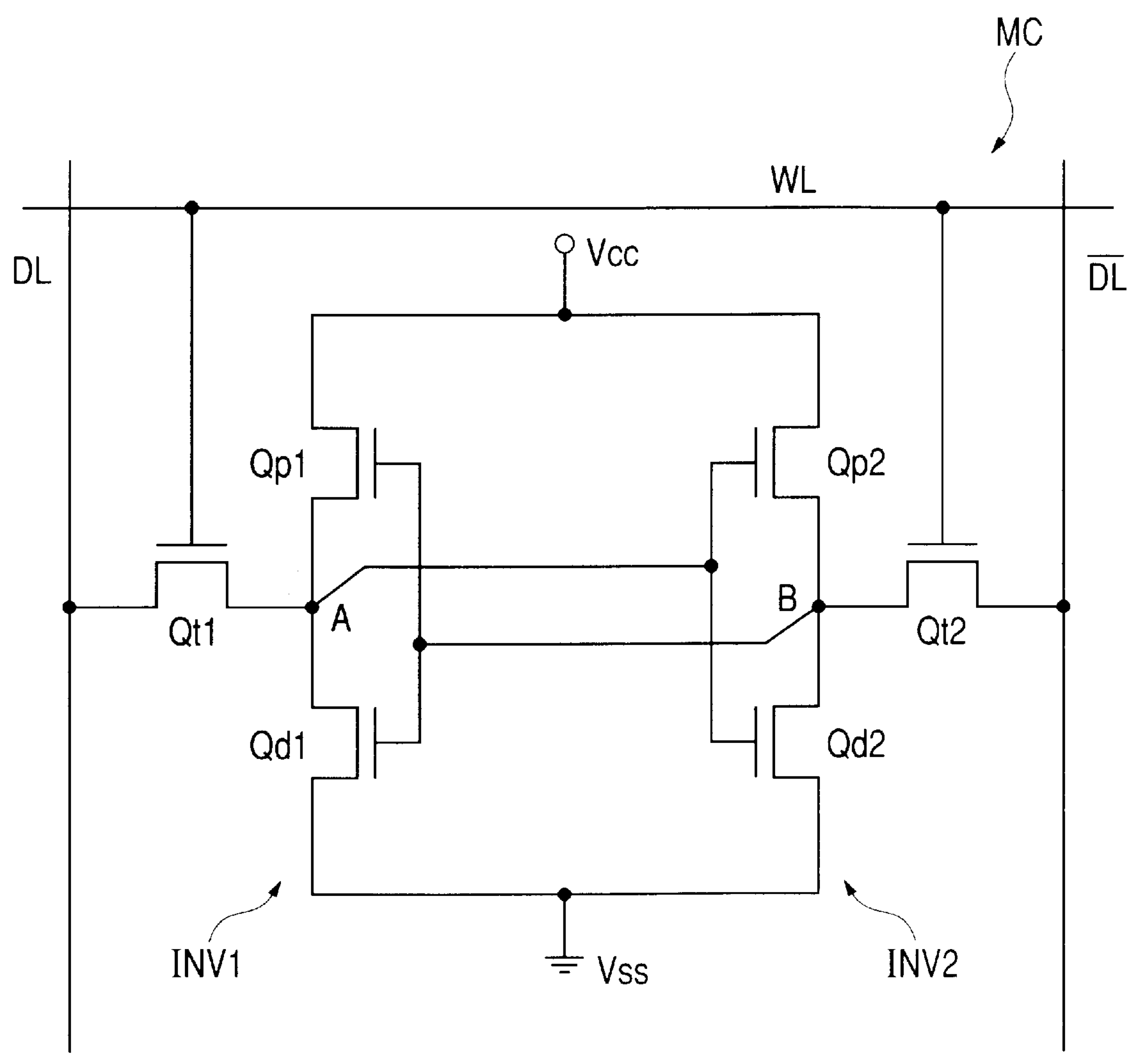
FIG. 1 is an equivalent circuit diagram illustrating the memory cell of an SRAM according to Embodiment 1 of the present invention.

FIG. 1 is an equivalent circuit diagram illustrating the memory cell of an SRAM according to Embodiment 1. As illustrated in this diagram, this memory cell MC is disposed at the intersection of a pair of complementary data lines (data line DL, data line/(bar) DL) and a word line WL and has a pair of driver MISFETs Qd1,Qd2, a pair of load MISFETs Qp1,Qp2 and a pair of transfer MISFETs Qt1,Qt2. The driver MISFETs Qd1,Qd2 and transfer MISFETs Qt1, Qt2 are each formed of an n-channel type MISFET, while the load MISFETs Qp1,Qp2 are each formed of a p-channel type MISFET.

Among the above-described 6 MISFETs constituting the memory cell MC, the driver MISFET Qd1 and load MISFET Qp1 constitute a CMOS inverter INV1, while the driver MISFET Qd2 and load MISFET Qp2 constitute a CMOS inverter INV2. Input-output terminals (storage nodes A,B) of a pair of these CMOS inverters INV1,INV2 are cross-connected and constitute a flip-flop circuit serving as an information storage portion for storing one bit of data. One of the input-output terminals (storage node A) of this flip-flop circuit is connected to one of the source and drain regions of the transfer MISFET Qt1, while the other input-output terminal (accumulation node B) is connected to one of the source/drain regions of the transfer MISFET Qt2.

The other one of the source and drain regions of the transfer MISFET Qt1 is connected to the data line DL, while the other one of the source and drain regions of the transfer MISFET Qt2 is connected to the data line/DL. One end (the source region of each of the load MISFETs Qp1,Qp2) of the flip-flop circuit is connected to a power voltage (Vcc), while the other end (the source region of each of the driver MISFETs Qd1,Qd2) is connected to a reference voltage (Vss).

The above-described circuit works in the following manner: when the storage node A of the CMOS inverter INV1 is at a high potential ("H"), the driver MISFET Qd2 is turned ON, by which the storage node B of the other CMOS inverter INV2 becomes low potential ("L"). The driver MISFET Qd1 therefore is turned OFF, whereby the high potential ("H") of the storage node A is maintained. In other words, while the mutual state of the storage nodes A,B is maintained by a latch circuit having a pair of CMOS inverters INV1,INV2 cross-connected to each other and the power voltage is applied, information is stored.

The word line WL is connected to the gate electrode of each of the transfer MISFETs Qt1,Qt2 and by this word line WL, conduction or non-conduction between the transfer MISFETs Qt1,Qt2 is controlled. More specifically, when the word line WL is at a high potential ("H"), the transfer MISFETs Qt1,Qt2 are turned ON, whereby the latch circuit is electrically connected to the complementary data lines (data lines DL,bar DL). Then, the potential state ("H" or "L") of the storage nodes A,B appears on the data lines DL,/DL and it is read as information of the memory cell MC.

In order to write information in the memory cell MC, the word line WL is set at the potential level "H" and the transfer MISFETs Qt1,Qt2 are turned ON, whereby the information of the data lines DL,/DL are transmitted to the storage nodes A,B.

Figure 2:
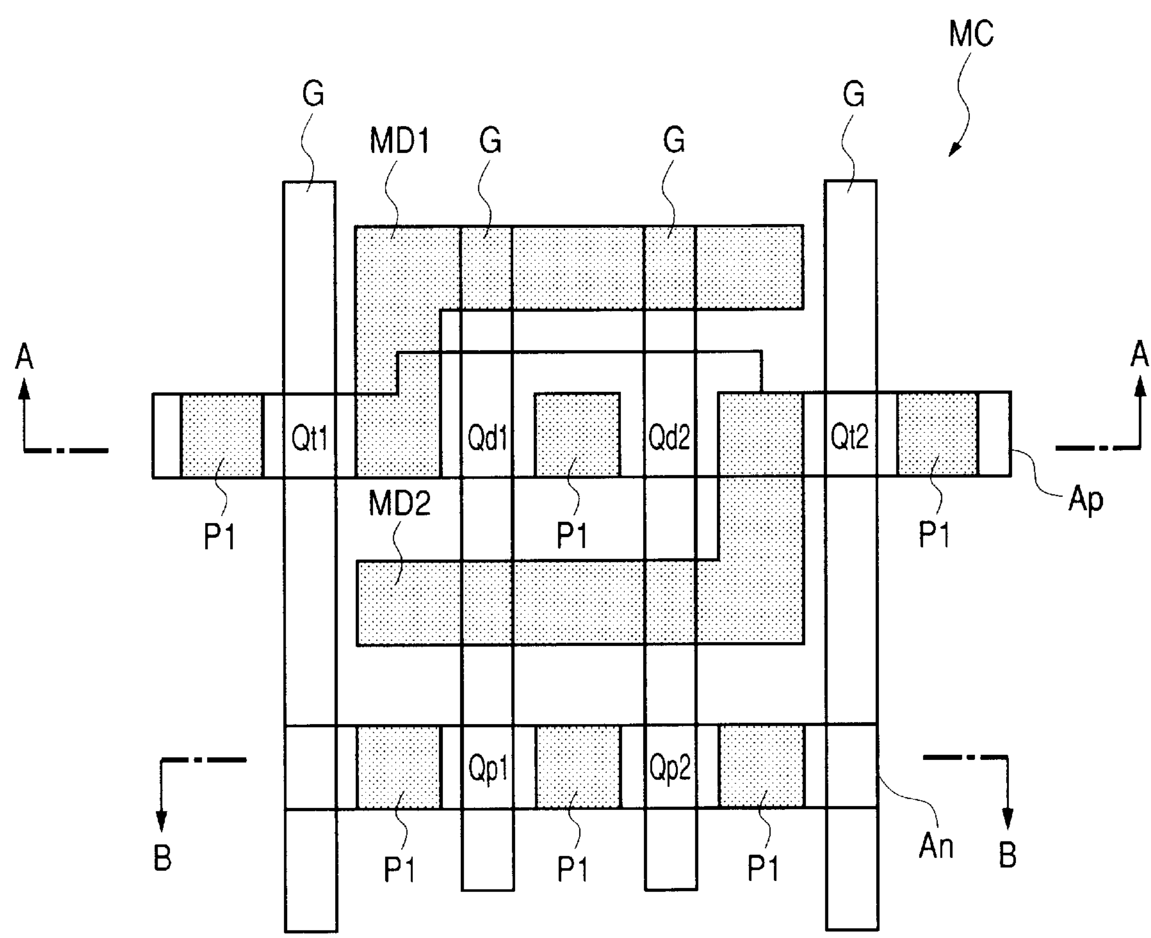
FIG. 2 is a diagrammatic plan view of a semiconductor substrate for illustrating a region corresponding to about one SRAM memory cell according to Embodiment 1 of the present invention.
Figure 3:
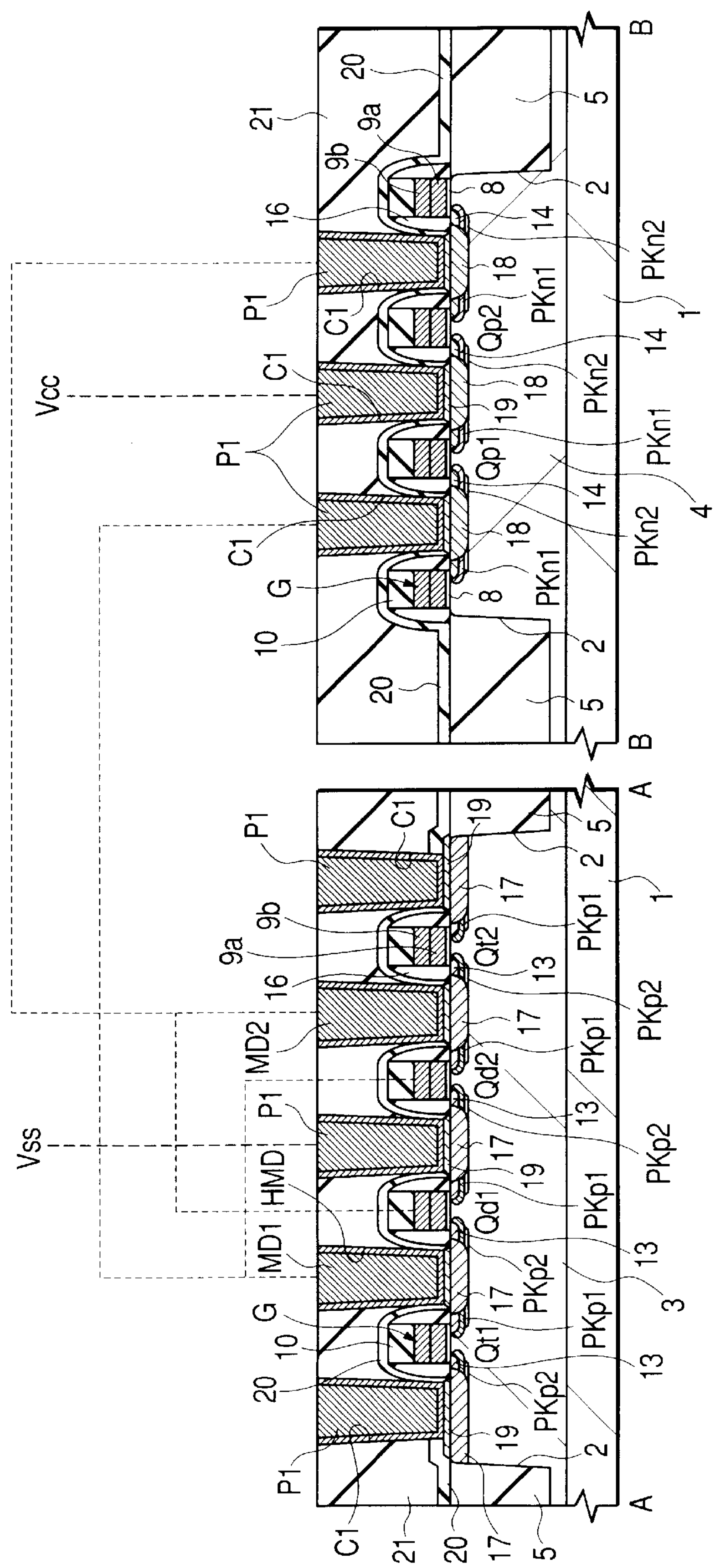
FIG. 3 is a cross-sectional view of the semiconductor substrate illustrating a region corresponding to about one SRAM memory cell according to Embodiment 1 of the present invention.

The constitution of the memory cell according to this embodiment will be described with reference to FIGS. 2 and 3. FIG. 2 is a plan view of a semiconductor substrate for illustrating a region corresponding to about one memory cell, and FIG. 3 is a cross-sectional view taken along line A—A in FIG. 2 on the left side and along line B—B in FIG. 2 on the right side. In FIG. 2, only conductive layers constituting the memory cell and connecting holes for connecting these conductive layers are illustrated, and an insulating film formed between the conductive layers is not illustrated.

As illustrated in FIGS. 2 and 3, among the six MISFETs (Qt1,Qt2,Qd1,Qd2,Qp1,Qp2) constituting the memory cell MC, the n-channel type MISFET5 (Qt1,Qt2,Qd1,Qd2) are formed over an active region Ap (p type well 3), while the p-channel type MISFETs (Qp1,Qp2) are formed over an active region An (n type well 4). These active regions Ana are each surrounded by an element isolating region 2 having a silicon oxide film 5 embedded therein, and, over the active regions An,AP, gate electrodes G are formed in parallel with each other. The load MISFET Qp1 and driver MISFET Qd1 have a gate electrode in common, while the load MISFET Qp2 and driver MISFET Qd2 have a gate electrode in common.

The gate electrodes G are made of a polycrystalline silicon film 9*a*, a tungsten nitride (WN) film (not illustrated) and a tungsten (W) film 9*b*; and, each gate electrode G is covered at the upper and side portions with a silicon nitride film 10 and a side wall film 16, and has a gate insulating film 8 formed below it.

In a semiconductor substrate 1 on both sides of this gate electrode G, semiconductor regions 13,14,17,18 (not illustrated in FIG. 2) constituting the LDD type source and drain of each of the MISFETs (Qt1,Qt2,Qd1,Qd2,Qp1,Qp2) are formed. Below the semiconductor regions 13,14, pocket ion regions PKp1,PKp2,PKn1,PKn2 are formed. The constitution of these pocket ion regions PKp1,PKp2,PKn1,PKn2 will be described later in more detail.

Over the semiconductor regions 13,14,17,18 constituting the LDD type source and drain, plug P1 for connecting the source/drain to a first-level interconnection (not illustrated), and damascene interconnections MD1,MD2 for connecting the source/drain and gate electrode G are formed. In other words, the drain of the driver MISFET Qd1 is connected to the gate electrode of the driver MISFET Qd2 (gate electrode of the load MISFET Qp2) by the damascene interconnection MD1, while the drain of the driver MISFET Qd2 is connected to the gate electrode of the driver MISFET Qd1 (the gate electrode of the load MISFET Qp1) via the damascene interconnection MD2. The drain of the driver MISFET Qd1 is connected to the drain of the driver MISFET Qp1 via the below-described first-level interconnection, while the drain of the driver MISFET Qd2 is connected to the drain of the load MISFET Qp2 via the below-described first-level interconnection. The source of the load MISFET Qp1 (the source of the load MISFET Qp2) is connected to the first-level interconnection to which the power voltage Vcc is fed, while the source of the driver MISFET Qd1 (the source of the driver MISFET Qd2) is connected to the first level interconnection to which a reference voltage Vss is fed.

Figure 4:
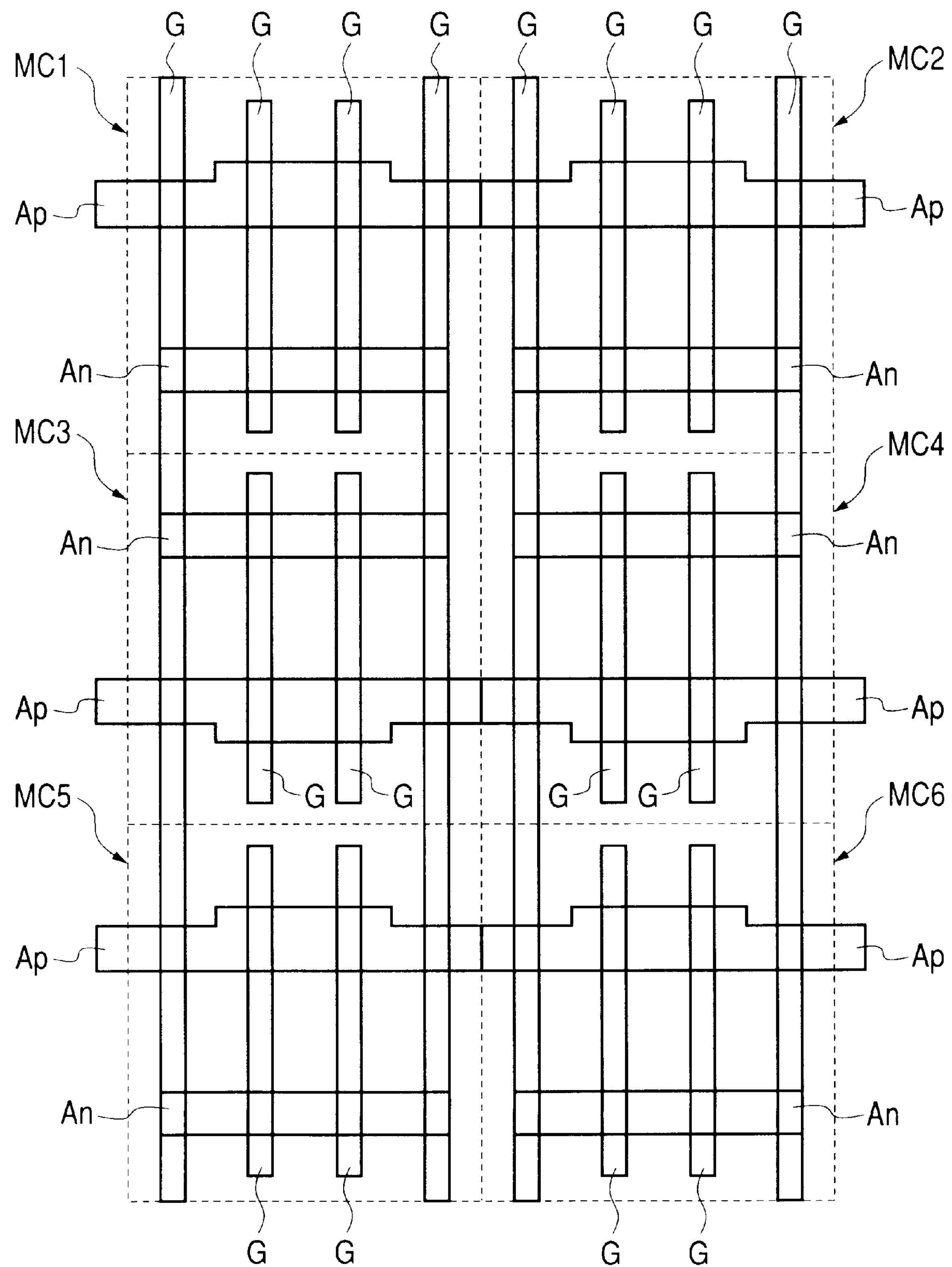
FIG. 4 is a fragmentary diagrammatic plan view of the semiconductor substrate illustrating the SRAM memory cell forming region according to Embodiment 1 of the present invention.

FIG. 4 is a plan view of the semiconductor substrate 1 illustrating the layout of a plurality of the above-described memory cells MC5. In this diagram, a rectangular region surrounded by a broken line is a region occupied by one memory cell MC. A memory cell array is formed by disposing a plurality of memory cells MCs in repeated patterns. In this case, memory cells MC3,MC4 are disposed symmetrically with respect to memory cells MC1,MC2, while memory cells MC5,MC6 are disposed symmetrically with respect to memory cells MC3,MC4. In FIG. 4, only the gate electrode G and active regions An,Ap are illustrated, and the damascene interconnections MD1,MD2 and plug P1 are omitted.

Figure 5:
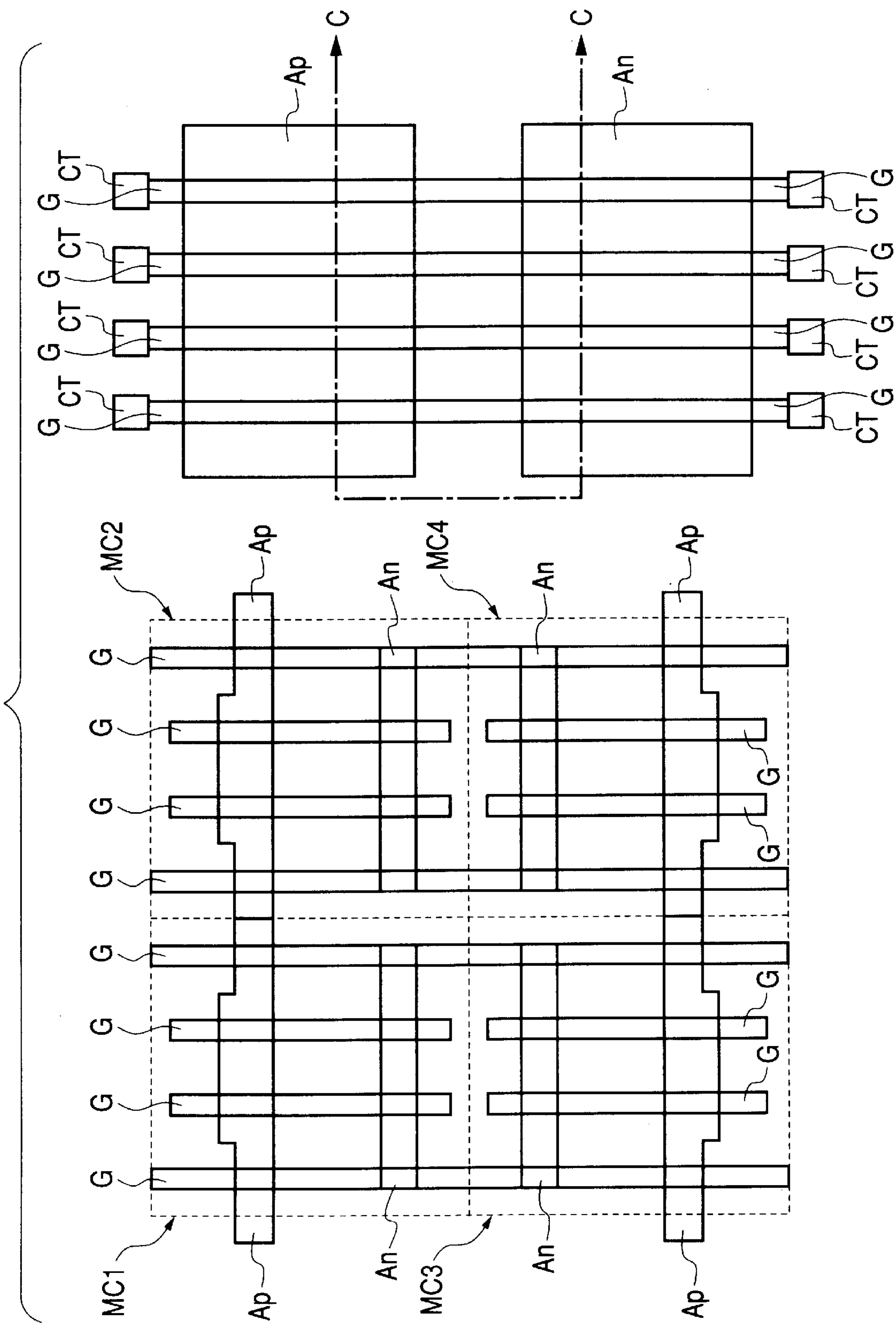
FIG. 5 is a fragmentary diagrammatic plan view of the semiconductor substrate illustrating the SRAM memory cell forming region and a peripheral circuit forming region according to Embodiment 1 of the present invention.
Figure 6:
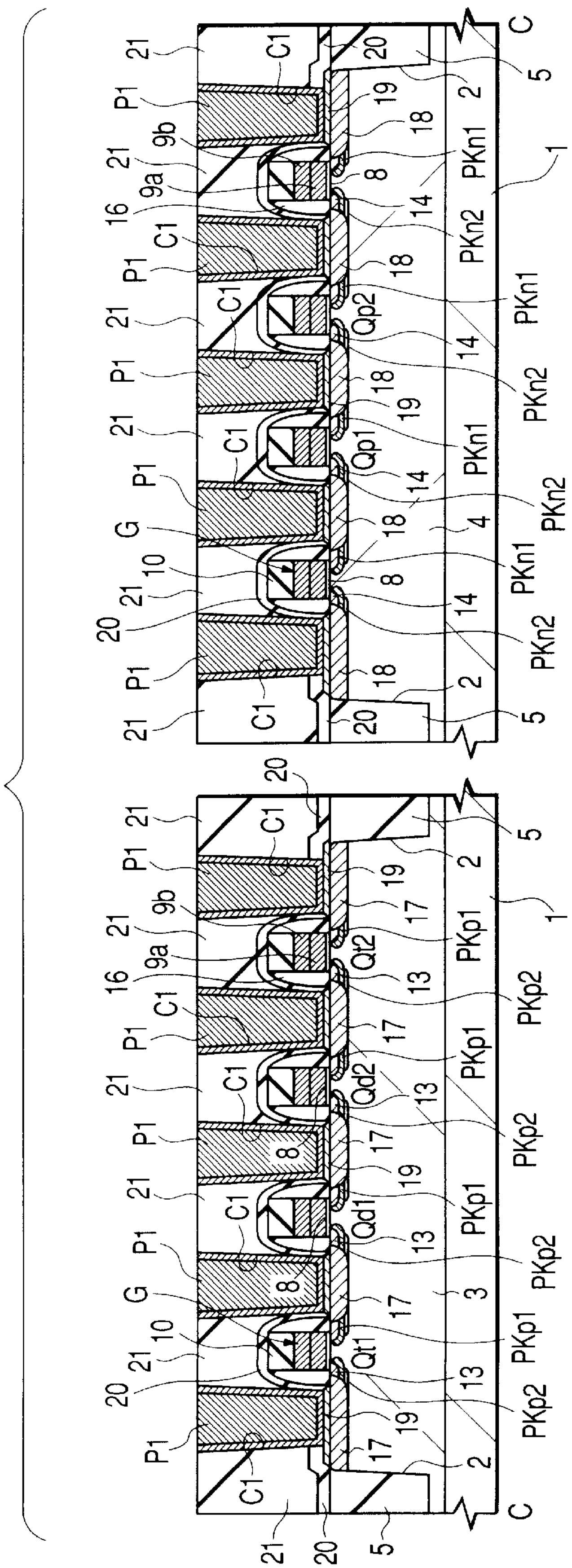
FIG. 6 is a fragmentary cross-sectional view of the semiconductor substrate illustrating the SRAM peripheral circuit forming region according to Embodiment 1 of the present invention.

As illustrated in FIG. 5, a peripheral circuit region (on the right side of FIG. 5) wherein a logic circuit or the like is to be formed exists at the periphery of the memory cell arrays MC1 to MC4, whereby a complementary MISFET is formed. FIG. 6 is a cross-sectional view taken along a line C—C of FIG. 5. As illustrated in FIGS. 5 and 6, the n-channel type MISFET and p-channel type MISFET of the peripheral circuit region are formed over the active region Ap (p type well 3) and active region An (n type well 4), respectively. These active regions Ap,An are surrounded by an element isolating region 2 having a silicon oxide film 5 embedded therein; and, over the active regions An,Ap, gate electrodes G are formed in parallel with each other. The n-channel type MISFET and p-channel type MISFET have a gate electrode in common.

The gate electrodes G are made of a polycrystalline silicon film 9*a*, a WN film (not illustrated) and a W film 9*b*; and, each gate electrode G is covered at the upper and side portions, with a silicon nitride film 10 and a side wall film 16, and has a gate insulating film 8 formed below it.

In the semiconductor substrate 1 on both sides of the gate electrode G, semiconductor regions 13,14,17,18 (not illustrated in FIG. 2) constituting the LDD-type source/drain of MISFET are formed. Below the semiconductor regions 13,14, pocket ion regions PKp1,PKp2,PKn1,PKn2 are formed. These pocket ion regions PKp1,PKp2,PKn1,PKn2 will be described later in more detail.

Over the semiconductor regions 13,14,17,18 constituting the LDD-type source/drain, a plug 1 for connecting the source/drain to the first-level interconnection (not illustrated) is formed. At the end portion of the gate electrode G, a contact portion CT for connecting the gate electrode G to the first-level interconnection or the like is formed.

A method of manufacture of the SRAM of this embodiment having the above-described constitution will next be described with reference to FIGS. 7 to 29.

Figure 7:
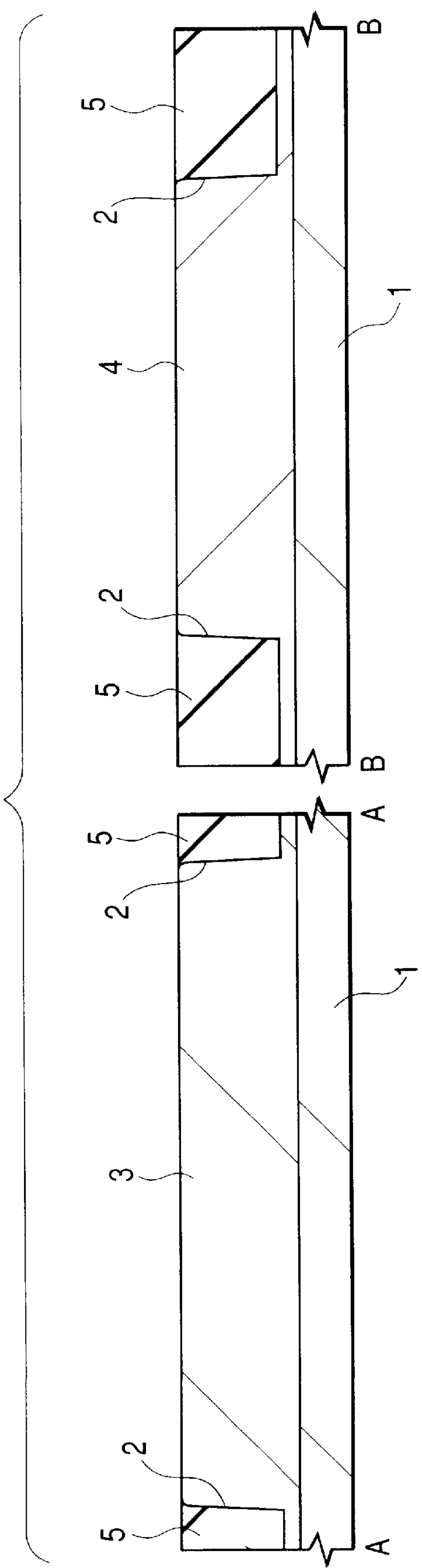
FIG. 7 is a fragmentary cross-sectional view of the semiconductor substrate illustrating a step in the method of manufacture of the SRAM memory cell forming region according to Embodiment 1 of the present invention.
Figure 8:
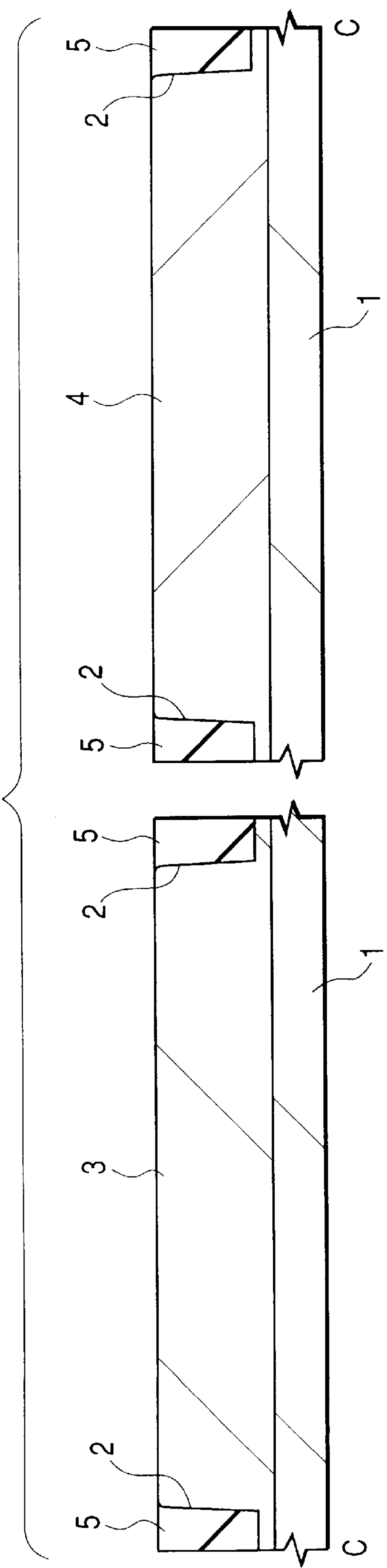
FIG. 8 is a fragmentary cross-sectional view of the semiconductor substrate illustrating a step in the method of manufacture of the SRAM peripheral circuit forming region according to Embodiment 1 of the present invention.

As illustrated in FIGS. 7 and 8, an element isolating region 2 is formed in a semiconductor substrate 1. This element isolating region 2 is formed as follows. The semiconductor substrate 1 having a specific resistance of about 1 to 10 Ωcm and is made of a p type single crystal silicon is etched to form an element isolating groove of about 250 nm thick. FIG. 7 illustrates a memory cell formation region, while FIG. 8 illustrates a peripheral circuit forming region.

By thermal oxidation of the semiconductor substrate 1 at about 1000° C., a thin silicon oxide film (not illustrated) of about 10 nm thick is formed on the inside wall of the groove. This silicon oxide film is formed in order to recover any damage to the inside wall of the groove produced by dry etching and at the same time to relax the stress appearing on the interface between the silicon oxide film 5 to be embedded inside of the groove in the subsequent step and the semiconductor substrate 1.

Over the semiconductor substrate 1, including the inside of the groove, the silicon oxide film 5 is deposited to a thickness of about 450 to 500 nm by CVD (Chemical Vapor Deposition), followed by polishing of the silicon oxide film 5 on the groove by chemical mechanical polishing (CMP) to planarize its surface.

After ion implantation of a p type impurity (boron (B)) and an n type impurity (phosphorous (P)) in the semiconductor substrate 1, these impurities are diffused by thermal treatment at about 1000° C., whereby a p type well 3 and an n type well 4 are formed in the semiconductor substrate 1 in the memory cell forming region and peripheral circuit forming region.

Figure 9:
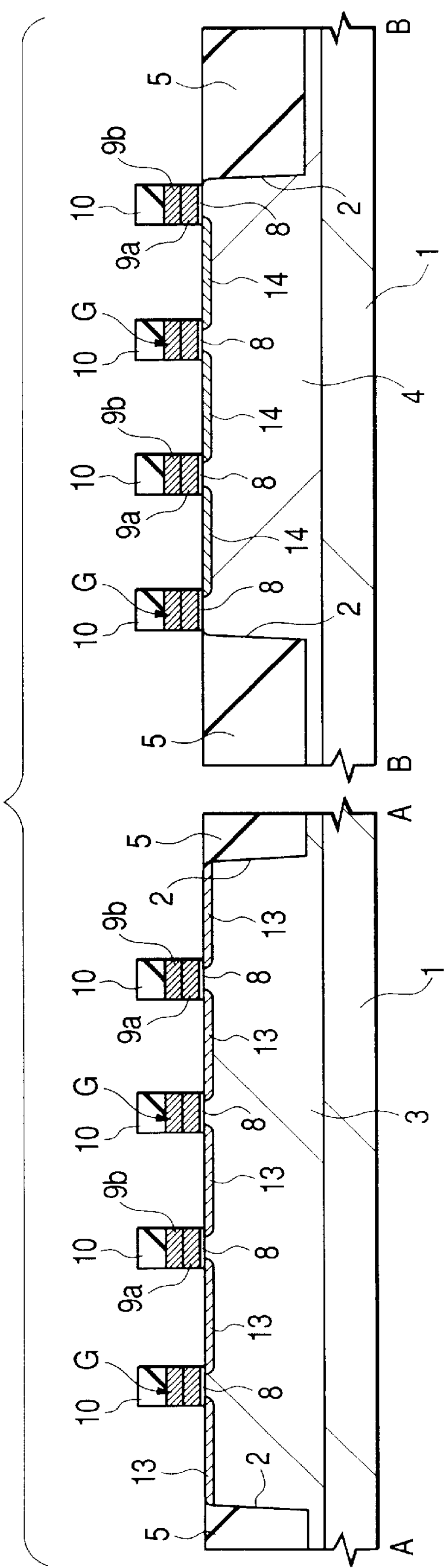
FIG. 9 is a fragmentary cross-sectional view of the semiconductor substrate illustrating a step in the method of manufacture of the SRAM memory cell forming region according to Embodiment 1 of the present invention.
Figure 10:
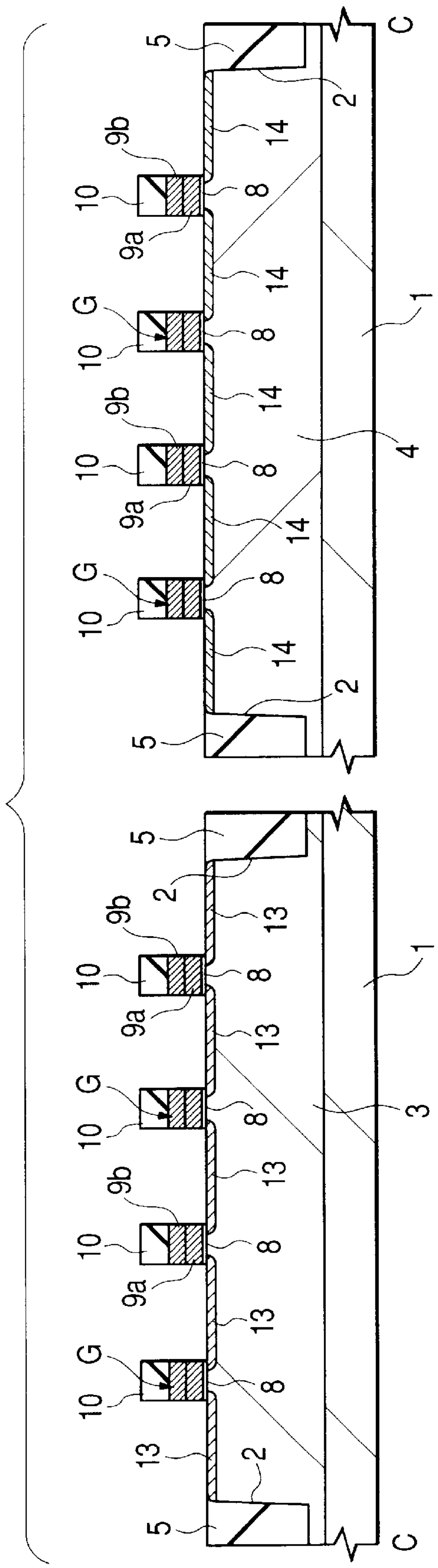
FIG. 10 is a fragmentary cross-sectional view of the semiconductor substrate illustrating a step in the method of manufacture of the SRAM peripheral circuit forming region according to Embodiment 1 of the present invention.

As illustrated in FIGS. 9 and 10, after wet washing on the surface of the semiconductor substrate 1 (p type well 3 and n type well 4) with a hydrofluoric acid type washing liquid, a clean gate oxide film 8 of about 6 nm thick is formed on the surface of each of the p type well 3 and n type well 4 by thermal oxidation at about 800° C. FIG. 9 illustrates the memory cell forming region, while FIG. 10 illustrates the peripheral circuit forming region.

Over the gate oxide film 8, a low-resistance polycrystalline silicon film 9*a* of about 100 nm thick is deposited by CVD. Over the polycrystalline silicon film, a WN film (not illustrated) of about 10 nm thick and a W film 9*b* of about 50 nm thick made of tungsten, a refractory metal, are deposited by sputtering, followed by deposition thereover of a silicon nitride film 10 of about 200 nm thick by CVD. Thermal treatment at about 800° C. in an inert gas atmosphere, such as nitrogen, is then conducted to relax the stress of the W film 9*b* and density the WN film.

Using a photoresist film (not illustrated) as a mask, the silicon nitride film 10 is dry etched to leave a portion of the silicon nitride film 10 in a region wherein a gate electrode is to be formed.

Using the silicon nitride film 10 as a mask, the W film 9*b*, WN film (not illustrated) and polycrystalline silicon film 9*a* are dry etched to form a gate electrode G made of the polycrystalline silicon film 9*a*, WN film and W film 9*b* a in each of the memory cell forming region and peripheral circuit forming region.

On both sides of the gate electrode G over the p type well in each of the memory cell forming region and peripheral circuit forming region, an n type impurity (phosphorous) is injected, whereby an $n^-$ type semiconductor region 13 is formed. Over the n type well 4 in each of the memory cell forming region and peripheral circuit forming region, a p type impurity (arsenic) is injected to form a $p^-$ type semiconductor region 14.

In order to suppress short channel effects, a p type impurity is injected below the $n^-$ type semiconductor region 13 of each of the memory cell forming region and peripheral circuit forming region to form p type pocket ion regions PKp1,PKp2, while an n type impurity is injected below the $p^-$ type semiconductor region 14 to form n type pocket ion regions PKn1, PKn2.

A step for forming these p type and n type pocket ion regions PKp1,PKp2,PKn1,PKn2 will next be described in detail with reference to FIGS. 11 and 12.

First, the upper portion of the n channel type MISFET is covered with a resist film and n type pocket ion regions PKn1,PKn2 are formed in the p channel type MISFET forming region.

Figure 11:
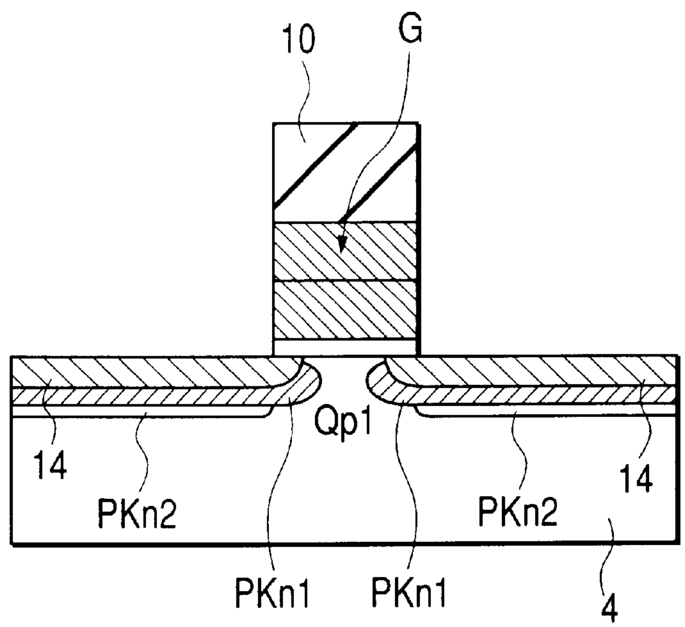
FIG. 11 is a fragmentary cross-sectional view of the semiconductor substrate illustrating a step in the method of manufacture of the SRAM memory cell forming region according to Embodiment 1 of the present invention.

FIG. 11 is an enlarged view of the gate electrode G and source and drain regions of the p channel type MISFET, for example, Qd1, of the memory cell forming region. FIG. 12 is an enlarged view of the gate electrode G and source and drain regions of the p channel type MISFET of the peripheral circuit forming region.

Figure 12:
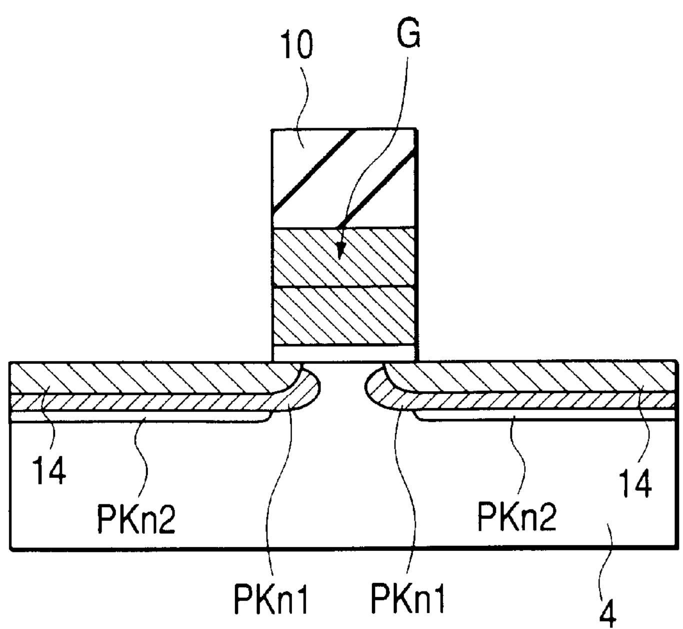
FIG. 12 is a fragmentary cross-sectional view of the semiconductor substrate illustrating a step in the method of manufacture of the SRAM peripheral circuit forming region according to Embodiment 1 of the present invention.

As illustrated in FIGS. 11 and 12, an n type impurity (phosphorous) is injected to both sides of the gate electrode G over the n type well 4 in each of the memory cell forming region and peripheral circuit forming region. Injection of this impurity is conducted by a so-called oblique ion implantation method. This method is adopted because the impurity is injected not only in a region below the $p^-$ type semiconductor region 14, but also in a region below the gate electrode G (the region below the gate electrode G is a channel region). In the peripheral circuit region, the gate electrode may extend not only in the vertical direction, as the drawing shows (refer to FIG. 5), but also in the lateral direction as well, so that the impurity is injected from four directions relative to the gate electrode.

The term "four directions" as used herein means the following four directions: a first direction (1) having an angle of (90°-θ) relative to the side surface Li of the longitudinal direction of the gate electrode and having an angle of θ relative to the surface of the semiconductor substrate; a second direction (2) having an angle of (90°-θ) relative to the side surface L2 of the longitudinal direction of the gate electrode and having an angle of 8 relative to the surface of the semiconductor substrate; a third direction (3) having an angle of (90°-θ) relative to the side surface Hi of the width direction of the gate electrode and having an angle of θ relative to the surface of the semiconductor substrate; and a fourth direction (4) having an angle of (90°-θ) relative to the side surface H2 of the width direction of the gate electrode and having an angle of θ relative to the surface of the semiconductor substrate. FIG. 13(*a*) is a top view showing the injecting directions of an impurity relative to the gate electrode, while FIG. 13(*b*) is a sectional view illustrating the injecting directions of an impurity relative to the cross-sectional view of the gate electrode.

As illustrated in FIG. 13(*b*), the first pocket ion region PKn1 which lies at a shallow position and extends to a region (channel region) below the gate electrode G is formed by injection of an impurity from the first direction (1) and the second direction (2), while the second pocket ion region PKn2 disposed at a deeper position than the first pocket ion region is formed by injection of an impurity from the third direction (3) and fourth direction (4).

As illustrated in FIG. 14, however, in the memory cell forming region, the forming regions of the n channel type MISFETs Qti,Qt2,Qdi,Qd2 are covered at the upper surface thereof with resist films Rn1,Rn2 upon pocket ion injection to the p channel type MISFET Qpi,Qp2. Since the forming regions of the p channel type MISFETs Qp1,Qp2 of the memory cells MC1,MC2 exist within a shielded region Si formed by the resist film Rn1, the impurity from the third direction (3) is not injected to these regions (refer to FIG. 15(*a*)). Since the forming regions of the p channel type MISFETs Qp1,Qp2 of the memory cell MC1,MC2 exist within a shielded region S2 formed by the resist film Rn2, the impurity from the fourth direction (4) is not injected to these regions (refer to FIG. 15(*b*)). FIG. 15(*a*) is a D—D cross-sectional view of FIG. 14, and FIG. 15(*b*) is an E—E cross-sectional view of FIG. 14.

In the first pocket ion region PKn1, an impurity is injected from two directions, that is, the first direction (1) and the second direction (2), but in the second pocket ion region PKn2, an impurity is injected from only one direction, that is, the third direction (3) or the fourth direction (4), so that an impurity concentration is lower in the second pocket ion region PKn2 than the first pocket ion region PKn1.

The term "shielded regions Si,S2" as used herein means regions disposed apart from the end portions PRn1,PRn2 of the resist films Rn1 and Rn2 on the side of the p channel MISFET by a distance S (S=Htanθ) which is obtained from the product of the thickness H of the resist film and the tangent of the impurity injection angle θ. The resist films Rn1,Rn2 must cover at least a region (in this case, active region Ap) to be covered by the resist and a region spaced apart from the end portion thereof by an alignment margin, which is set in consideration of the deviation that occurs upon mask alignment. In this embodiment, the thickness H of the resist film is 1.0 μm, the impurity injection angle θ is 20°, and the distance S is 0.36 μm.

The p channel type MISFETs Qp1,Qp2 are formed within the shielded regions S1,S2 in this manner so that upon pocket ion injection to the p channel type MISFETs Qp1, Qp2, an impurity is injected only from one direction, the third direction (3) or the fourth direction (4), which makes it possible to prevent fluctuations in the threshold voltage Vth due to fluctuations in the impurity concentration in the second pocket ion region PKn2 caused by mask misregistration of the resist film.

In addition, a reduction in the cell area can be attained because the p channel type MISFETs Qp1,Qp2 are formed within the shielded regions S1,S2.

As illustrated in FIG. 16(*a*), when an impurity is injected from all of the first to fourth directions, the p channel type MISFETs Qp1,Qp2 must be formed in a region other than the shielded regions S1,S2; in other words, the forming regions of the p channel type MISFETs Qp1,Qp2 must be spaced from the end portions PRn1,PRn2 of the resist film by at least distances S1,S2, which are determined from the product of the film thickness H of the resist film and the tangent of the impurity injection angle θ, respectively. It is therefore difficult to attain a reduction in the cell area.

Moreover, even if the forming regions of the p channel type MISFETs Qpi,Qp2 are spaced from the end portions PRn1,PRn2 of the resist film at least by the distances S1,S2, which are determined from the product of the film thickness H of the resist film and the tangent of the impurity injection angle θ, respectively, if misregistration of the mask occurs upon formation of the resist film (FIG. 16(*b*)), a region α wherein the impurity is injected from all of the four directions and a region β wherein the impurity cannot be injected owing to shielding by the resist film inevitably appear, resulting in the occurrence of fluctuations in the impurity concentration of the second pocket ion region PKn2. These fluctuations in the impurity concentration lead to fluctuations in the threshold voltage Vth of the MISFET.

In this embodiment, however, fluctuations in the threshold voltage Vth can be prevented and a reduction in the cell area can be attained as described above.

As illustrated in FIG. 17, in the peripheral circuit forming region, the n channel type MISFET forming region is covered with a resist film Rn3, while the p channel type MISFET forming region is disposed in a region other than the region S3 that is shielded by the resist film Rn3. In this embodiment, the thickness H of the resist film is 1.0 μm, and the impurity injection angle θ is 20°, so that the distance S3 becomes 0.36 μm. In the peripheral circuit region in this embodiment, since the distance between the p channel type MISFET forming region An and the n channel type MISFET forming region Ap is 0.8 μm, the impurity is injected from all of the first to fourth directions.

Accordingly the impurity concentration of the second pocket ion region PKn2 in the peripheral circuit forming region, which is illustrated in FIG. 12, becomes higher than that of the second pocket ion region PKn2 (FIG. 11) in the memory cell forming region to which the impurity is injected from only one direction, that is, the third direction (3) or the fourth direction (4).

After removal of the resist films Rn1,Rn2,Rn3, the p channel type MISFET forming regions are covered with the resist films Rp1,Rp2 to form p type pocket ion regions PKpi,PKp2 in the n channel type MISFET forming regions. Alternatively, n type pocket ion regions PKn1,PKn2 may be formed after formation of the p type pocket ion regions PKp1, PKp2.

FIG. 18 is an enlarged view of the gate electrode G and source and drain regions of the n channel type MISFET, for example, Qd1 of the memory cell forming region. FIG. 19 is an enlarged view of the gate electrode G and source and drain regions of the n channel type MISFET in the peripheral circuit forming region.

As illustrated in FIGS. 18 and 19, a p type impurity (arsenic As) is injected to both sides of the gate electrode G over the p type well 3 in each of the memory cell forming region and peripheral circuit forming region. Upon injection, this impurity is injected from four directions relative to the gate electrode G by using the oblique ion injection method similar to that used in the formation of the n type pocket ion regions PKn1,PKn2.

As illustrated in FIG. 20, in the memory cell forming region, the p channel type MISFET5 Qpi,Qp2 forming regions are covered, at the upper surface thereof, with resist films Rp1,Rp2 upon pocket ion injection to the n channel type MISFET Qt1,Qt2,Qd1,Qd2. Since the forming regions of the n channel type MISFETs Qt1,Qt2,Qd1,Qd2 of the memory cells MC3,MC4 exist within a region S4 that is shielded by the resist film Rp1, the impurity from the third direction (3) is not injected to these regions. Since the forming regions of the n channel type MISFETs Qti,Qt2, Qdi,Qd2 of the memory cells MC5,MC6 exist within a region S5 that is shielded by the resist film Rp2, the impurity from the fourth direction (4) is not injected to these regions.

As illustrated in FIG. 18, in the first pocket ion region PKp1, an impurity is injected from two directions, that is, the first direction (1) and the second direction (2), but in the second pocket ion region PKp2, an impurity is injected from only one direction, that is, the third direction (3) or the fourth direction (4) so that the impurity concentration is lower in the second pocket ion region PKp2 than the first pocket ion region PKp1.

As illustrated in FIG. 21, in the peripheral circuit region, the p channel type MISFET forming region is covered with the resist film Rp3. The n channel type MISFET forming region is disposed in a region other than a region S6 that is shielded by the resist film Rp3 so that an impurity is injected from all of the first to fourth directions at the gate electrode G of the p channel type MISFET.

The impurity concentration in the second pocket ion region PKp2 of the peripheral circuit forming region illustrated in FIG. 19 becomes higher than that of the second pocket ion region PKp2 (FIG. 18) in the memory cell forming region to which an impurity is injected from only one direction, that is, the third direction (3) or fourth direction (4).

The forming regions of the n channel type MISFETs Qti,Qt2,Qd1,Qd2 regions are disposed within the shielded regions S4,S5 in this manner so that upon pocket ion injection to the n channel type MISFETs Qt1,Qt2,Qd1,Qd2, the impurity is injected only from one direction, that is, the third direction (3) or the fourth direction (4), which makes it possible to prevent fluctuations of the threshold voltage Vth due to the fluctuations of the impurity concentration in the second pocket ion region PKp2 caused by deviation of the mask of the resist films Rpi,Rp2, similar to the case upon formation of the p type pocket ion region.

In addition, a reduction in the area of the cell can be attained because the n channel type MISFETs Qt1,Qt2,Qd1, Qd2 are formed within the shielded regions S4, S5.

As illustrated in FIGS. 22 and 23, after deposition of a silicon nitride film of about 40 nm thick over the substrate 1 by CVD, anisotropic etching is conducted to form side wall spacers 16 on the side walls of the gate electrode G. FIG. 22 illustrates the memory cell forming region, while FIG. 23 illustrates the peripheral circuit forming region.

By ion implantation of an n type impurity (phosphorous or arsenic) to the p type well 3, $n^+$ type semiconductor regions 17 (source and drain) are formed; while, by ion implantation of a p type impurity (boron) to the n type well 4, $p^+$ type semiconductor regions 18 (source and drain) are formed.

By the above-described steps, six MISFETs (driver MISFETs Qdi,Qd2, transfer MISFET5 Qt1,Qt2 and load MISFETs Qp1,Qp2) constituting the memory cell MC and n channel MISFET and p channel MISFET constituting the peripheral circuit are completed.

As illustrated in FIGS. 24 and 25, after washing of the surface of the semiconductor substrate 1, a silicon film is allowed to selectively grow on the exposed portions ($n^+$ type semiconductor regions 17, $p^+$ type semiconductor regions 18) of the semiconductor substrate 1. A Co film and a Ti film are then deposited successively by sputtering. By heat treatment at 600° C. for 1 minute, a $CoSi_2$ layer 19 is formed at the contact portion of the silicon film and Co film. FIG. 24 illustrates the memory cell forming region, while FIG. 25 illustrates the peripheral circuit forming region.

After removal of the unreacted portions of the Co film and Ti film by etching, heat treatment is conducted at 700 to 800° C. for about 1 minute, whereby the resistance of the $CoSi_2$ layer 19 is lowered.

Over the semiconductor substrate 1, a silicon nitride film 20 of about 50 nm thick is deposited by CVD, followed by deposition of a silicon oxide 20 film 21 of about 700 to 800 nm thick over the silicon nitride film 17 by CVD. The silicon oxide film 21 is polished by CMP to planarize its surface. The silicon nitride film 17 serves as an etching stopper upon formation of a contact hole C1 and the like, which will be described later.

The silicon oxide film 21 is then dry etched using a photoresist film (not illustrated) as a mask, followed by dry etching of the silicon nitride film 20, whereby the contact hole C1 and interconnection grooves HMD are formed over the $n^+$ type semiconductor regions 17 (source and drain) and $p^+$ type semiconductor regions 18 (source and drain). These interconnection grooves HMD extend onto the gate electrode G of the MISFET5 Qd1,Qd2.

By embedding the contact hole C1 and interconnection grooves HMD with a conductive film, a plug P1 and interconnections MD1,MD2 are formed. More specifically, a Ti film (not illustrated) of about 10 nm thick and a TiN film of about 50 nm thick are deposited successively over the silicon oxide film 21 including the insides of the contact hole C1 and interconnection grooves HMD by sputtering, followed by heat treatment at is 500 to 700° C. for 1 minute. Then, a W film is deposited over the TiN film, followed by etchback or CMP to remove portions of the Ti film, TiN film and W film outside the contact hole, whereby the plug P1 and interconnections MD1,MD2 are formed.

By the above-described steps, the SRAM memory cell and the peripheral circuit thereof, which were described with reference to FIGS. 2 and 3, are completed.

Then, a first-level interconnection M1 and a second-level interconnection M2 are formed over the plug P1 and interconnections MD. The formation of these interconnections will next be described.

As illustrated in FIGS. 24 and 25, silicon oxide films 22,23 are deposited over the silicon oxide film 21, plug P1 and interconnections MD by CVD. Then, the silicon oxide films 22,23 over the contact region of the plug P1 or interconnections MD1,MD2 and the first-level interconnection are removed by etching, whereby a contact hole C2 is formed.

Over the silicon oxide film 23, including the inside of the contact hole C2, an antireflective film (not illustrated) is formed so that it is embedded inside of the contact hole C2. The antireflective film and silicon oxide film 23 over a region in which the first-level interconnection is to be formed are etched to form an interconnection groove HM1. The antireflective film remaining in the contact hole C2 is then removed. By the above-described steps, the interconnection groove HM for the first-level interconnection and contact hole for connecting the second interconnection to the plug P1 or interconnection MD are formed.

Alternatively, the contact hole C2 may be formed after forming the interconnection groove HM1 by etching the silicon oxide film 23 in a region wherein the first-level interconnection is to be formed, and then embedding the interconnection groove HM1 with the antireflective film. If films different in kind are employed as the silicon oxide films 22,23, their etching rates differ, which makes it easy to form the contact hole C2 and interconnection groove HM1. A silicon nitride film may be formed as an etching stopper between the silicon oxide films 22 and 23.

Over the silicon oxide film 23, including the insides of the interconnection groove HM1 and contact hole C2, a barrier layer made of titanium nitride is deposited by CVD, followed by deposition of a copper film over the barrier layer by electroplating. The copper film and the barrier layer outside the interconnection groove HM1 and contact hole C2 are removed by CMP, whereby the first-level interconnection M1, and connecting portion of the first-level interconnection M1 to the interconnection MD1 or MD2, or plug 1 are formed.

FIG. 26 is a plan view of the semiconductor substrate for illustrating a region corresponding to about one memory cell having the first-level is interconnection M1 formed thereon.

As illustrated in FIGS. 27 and 28, after deposition of a silicon nitride film 24 over the silicon oxide film 23 and first-level interconnection M1 by CVD in order to prevent the diffusion of the copper film constituting the first-level interconnection Mi, a second-level interconnection is formed in a similar manner to the first-level interconnection. More specifically, first, silicon oxide films 25,26 are deposited successively. The silicon oxide films 25,26 and silicon nitride film 24 over the contact region of the first-level interconnection Mi with the second-level interconnection are removed by etching, whereby a contact hole C3 is formed. FIG. 27 illustrates the memory cell forming region, while FIG. 28 illustrates the peripheral circuit forming region.

Over the silicon oxide film 26, including the inside of the contact hole C3, an antireflective film (not illustrated) is formed and embedded in the contact hole C3. An interconnection groove HM2 is then formed by etching the antireflective film and silicon oxide film 26 in a region wherein the second-level interconnection is to be formed. The antireflective film left in the contact hole C3 is then removed.

A barrier layer made of titanium nitride is then deposited over the silicon oxide film 26, including the interconnection groove HM2 and contact hole C3 by CVD, followed by formation of a copper film over the barrier layer by electroplating. The copper film and barrier layer outside the interconnection groove HM2 and contact hole C3 are removed by CMP, whereby a second-level interconnection M2 and a connecting portion of the first-level interconnection M1 to the second-layer interconnection M2 are formed.

FIG. 29 is a plan view of the semiconductor substrate illustrating a region corresponding to about one memory cell having the second-level interconnection M2 formed thereon.

In this embodiment, upon formation of the first-level interconnection M1 and the second-level interconnection M2, a so-called dual damascene method is employed for forming a connecting portion of these interconnections to the underlying interconnection. Alternatively, a single damascene method can be employed for forming an interconnection after forming a connecting portion.

Embodiment 2

FIG. 30 is an equivalent circuit diagram of a memory cell constituting an SRAM according to Embodiment 2. As illustrated in FIG. 30, a capacitor C is connected to both a gate electrode portion of a driver MISFET Qd1 and a load MISFET Qp1 and another gate electrode portion of a driver MISFET Qd2 and a load MISFET Qp2. This embodiment is similar to Embodiment 1 with respect to other features of the constitution, so a description thereof will be not repeated.

A method of fabrication of an SRAM according to Embodiment 2 will next be described with reference to FIGS. 31 to 35. The peripheral circuit forming region is manufactured in a manner similar to that of Embodiment 1, so only a memory cell forming region will be described. With regard to the memory cell forming region, steps up to the formation of the side wall 16, which was described with reference to FIG. 22, are similar to those of Embodiment 1, so that a description thereof is omitted here.

A semiconductor substrate 1 as illustrated in FIG. 22 is prepared. As illustrated in FIG. 31, a silicon nitride film 20 of about 50 nm thick is deposited over this semiconductor substrate 1 by CVD, followed by deposition of a silicon oxide film 21 of about 700 to 800 nm by CVD over the silicon nitride film 20. The silicon oxide film 21 is then polished by CMP to planarize its surface. The silicon nitride film 20 serves as an etching stopper upon formation of a contact hole C1 and the like, which will be described later.

By dry etching using a photoresist film (not illustrated) as a mask, the silicon oxide film 21 and the silicon nitride film 20 are dry etched successively, whereby the contact hole C1 and interconnection grooves HMD1,HMD22 are formed over the $n^+$ type semiconductor regions 17 (source, drain) and $p^+$ type semiconductor regions 18 (source, drain). Here, as illustrated in FIG. 32, the interconnection groove HMD1 extends onto the gate electrode of the MISFET Qd2, while the interconnection groove HMD22 extends onto the gate electrode of the MISFET Qd1 and the drain region of the MISFET Qp2.

By embedding a conductive film in the contact hole C1 and interconnection grooves HMD1,HMD22, a plug P1 and interconnections MD1,MD22 are formed. More specifically, over the silicon oxide film 21, including the insides of the contact hole C1 and interconnection grooves HMD1, HMD22, a Ti film (not illustrated) of about 10 nm thick and a TiN film of about 50 nm thick are deposited successively by sputtering, followed by heat treatment at 500 to 700° C. for 1 minute. A W film is then deposited by CVD. By etchback or CMP, the Ti film, TiN film and W film outside the contact hole are removed, whereby the plug P1 and interconnections MD1,MD22 are formed. This interconnection MD22 extends, as described above, onto the gate electrode of the MISFET Qdi and the drain region of the MISFET Qp2b (FIG. 32).

A silicon nitride film 201 is formed over the silicon oxide film 21. This silicon nitride film 201 formed between the interconnection MD22, which will be a lower electrode, and an upper electrode UL, which will be described later, will serve as a capacitor insulating film.

Over the silicon nitride film 201, a TiN film is deposited by sputtering. By patterning, the upper electrode UL extending over the interconnection MD22 and over a region between the source of the MISFET Qd1 and the drain of the MISFET Qp1 is formed (FIG. 33).

In this embodiment, the MISFETs Qt1,Qt2,Qd1,Qd2, Qp1,Qp2 are formed within shielded regions S1,S2 as in Embodiment 1, so that an impurity is injected only from one direction, that is, the third direction (3) or the fourth direction (4) upon pocket ion injection. This makes it possible to prevent fluctuations of the threshold voltage Vth due to the fluctuations of the impurity concentration in the second pocket ion regions PKn2,PKp2; and also to attain a reduction in the cell area.

Moreover, since a capacitor C made of the interconnection MD22, silicon nitride film 201 and lower electrode UL is formed between the cross couples (between the nodes AB of FIG. 31), information can be maintained more stably. More specifically, there is a danger of the MISFET Qp1 or the like operating in response to a surge voltage, because the threshold voltage Vt declines owing to the injection of an impurity into the second pocket ion regions PKn2,PKp2 from only one direction. By the formation of the capacitor C between cross couples (between nodes AB), however, charges due to a surge voltage are accumulated in this capacitor C, whereby the information of the MISFET can be maintained more stably.

As in Embodiment 1, a first-level interconnection M1 and a second-level interconnection M2 are then formed over the upper electrode UL.

First, over the plug P1, interconnection MD1 and upper electrode UL, silicon oxide films 22,23 are deposited successively by CVD. The silicon oxide films 23,22 over the contact region of the plug P1 or the interconnection MD1 with the first-level interconnection are removed by etching, whereby a contact hole C2 is formed. An antireflective film (not illustrated) is embedded in the contact hole C2. The antireflective film and silicon oxide film 23, in a region wherein the first-level interconnection is to be formed, are etched to form an interconnection groove HM1. Alternatively, the contact hole C2 may be formed after formation of the interconnection groove HM1. It is also possible to easily form the contact hole C2 and interconnection groove HM1 by changing the kind of silicon oxide films 22,23. Between the silicon oxide films 22 and 23, a silicon nitride film may be formed as an etching stopper.

Over the silicon oxide film 23, including the interconnection HM1 and contact hole C2, a barrier layer made of titanium nitride is then deposited by CVD, followed by the formation of a copper film over the barrier layer by electroplating. The copper film and barrier layer outside the interconnection HM1 and contact hole C2 are removed by CMP to form the first-level interconnection M1, and a connecting portion of the first-level interconnection M1 to the interconnection MD1 or MD 22, or the plug P1 are formed.

FIG. 34 is a plan view of the semiconductor substrate illustrating a region corresponding to about one memory cell having the first-level interconnection formed thereon.

After deposition of a silicon nitride film 24 over the silicon oxide film 23 and first-level interconnection M1 by CVD in order to prevent diffusion of the copper film constituting the first-level interconnection, silicon oxide films 25,26 are deposited successively. The silicon oxide films 25,26 and silicon nitride film 24, disposed over a contact region of the first-level interconnection M1 with the second-level interconnection, are removed by etching, whereby a contact hole C3 is formed.

An antireflective film (not illustrated) is embedded in the contact hole C3. The antireflective film and silicon oxide film 26, disposed over a region wherein a second-level interconnection is to be formed, are etched to form an interconnection groove HM2.

Deposition of a barrier layer made of titanium nitride over the silicon oxide film 26, including the inside of the interconnection groove HM2 and contact hole C3 by CVD, is followed by formation of a copper film over the barrier layer by electroplating. The copper film and barrier layer outside the interconnection groove HM2 and contact hole C3 are removed by CMP, whereby the second-level interconnection M2 and a connecting portion of the first-level interconnection M1 to the second-level interconnection M2 are formed.

FIG. 35 is a plan view of the semiconductor substrate illustrating a region corresponding to about one memory cell having the second-level interconnection M2 formed thereon.

In this embodiment, upon formation of the first-level interconnection and second-level interconnection, a so-called dual damascene method of forming these interconnections and a connecting portion to the underlying interconnection is employed. Alternatively, the single damascene method of forming an interconnection after forming a connecting portion can be employed.

Embodiment 3

In Embodiments 1 and 2, the pocket ion regions PKp1, PKp2 of the n channel type MISFET in each of the memory cell forming region and peripheral circuit forming region are formed in one step, but they may be formed in different steps. More specifically, the peripheral circuit forming region is covered with a resist film upon pocket ion injection to the memory cell forming region, and after formation in the pocket ion regions PKp1,PKp2 of the n channel type MISFET in the memory cell forming region, the pocket ion regions PKp1,PKp2 in the peripheral circuit forming region are formed. This will equally apply to the pocket ion regions PKn1,PKn2 of the p channel type MISFET.

Upon pocket ion injection in the memory cell forming region, an impurity can be injected only from the first and second directions, as described with reference to Embodiment 1. In this case, the second pocket ion regions PKn2, PKp2 are not formed in the memory cell forming region. This therefore makes it possible to prevent fluctuations of the threshold voltage Vth due to fluctuations of the impurity concentration of the second pocket ion regions PKn2,PKp2.

The invention made by present inventors so far has been described specifically with reference to various embodiments. It should however be borne in mind that the present invention is not to be limited to or by the disclosed embodiments. It is needless to say that they can be changed within an extent not departing from the scope of the invention.

In particular, the present invention is applied to the memory cell forming region of an SRAM for which miniaturization is required. It can also be applied widely to a semiconductor integrated circuit device having an n channel MISFET and a p channel MISFET formed in a fine region, such as sense amplifier SA formed inside of a DRAM (Dynamic Random Access Memory), as illustrated in FIG. 36. In FIG. 36, DMC denotes a DRAM memory cell, which is formed of a transfer MISFET QS and a capacitor C and is connected to both a word line WL and a bit line BL. The sense amplifier SA is formed of a pair of cross-connected CMOS inverters INV1,INV2 and is connected between the bit line BLs.

Advantages available by typical aspects and features of the invention disclosed in the present application will be summarized.

In accordance with the present invention, oblique ion injection is carried out while disposing a first region (for example, a p channel type MISFET forming region) at a distance S1 from the end portion of a resist film formed over a second region (for example, an n channel type MISFET forming region), the distance Si being a product of the thickness H of the resist film and the tangent of an ion injection angle 9. In such oblique ion injection, injection of the impurity from one of four directions is not carried out, making it possible to prevent fluctuation of the impurity concentration in the pocket ion region of the MISFET in the first region, thereby preventing fluctuation of the threshold voltage Vth, so as to attain a reduction in the cell area.

What is claimed is:

1. A method for manufacturing a semiconductor integrated circuit device, comprising the steps of:

(a) providing a semiconductor substrate having a memory cell forming region, in which memory cells are to be formed, the memory cells including MISFETs of a first conductivity type to be formed in first regions of the memory cell forming region and MISFETs of a second conductivity type, opposite to the first conductivity type, to be formed in second regions of the memory cell forming region;

(b) covering the second regions of the memory cell forming region with resist films, the resist films having a thickness; and (c) introducing impurities into the memory cell forming region by oblique ion injection, in at least third and fourth directions, using the resist films as a mask, wherein thickness of the resist films, and angle of the oblique ion injection, are such that the impurities introduced by the oblique ion injection from the third and fourth directions are shielded from introduction into the first regions of the memory cell forming region, wherein said memory cell forming region is a region in which at least memory cells MC1 and MC2 are to be formed, and wherein impurities introduced by oblique ion injection in step (c) from the third and fourth directions are shielded by the resist films from introduction into the first regions of MC1 and MC2.

2. A manufacturing method of a semiconductor integrated circuit device according to claim 1, wherein each memory cell of the memory cell forming region includes two MISFETs in the first regions and four MISFETs in the second regions.

3. A manufacturing method of a semiconductor integrated circuit device according to claim 1, wherein each memory cell is a static random access memory, having two load MISFETs in the first regions, and two driver MISFETs and two transfer MISFETs in the second regions.

4. A manufacturing method of a semiconductor integrated circuit device according to claim 3, wherein the two load MISFETs are p-channel MISFETs, and the two driver MISFETs and the two transfer MISFETs are n-channel MISFETs.

5. A manufacturing method of a semiconductor integrated circuit device according to claim 4, wherein the introduction of impurities in step (c) is for forming pocket ion regions for the MISFETs formed in the first regions.

6. A manufacturing method of a semiconductor integrated circuit device according to claim 1, wherein the introduction of impurities in step (c) is for forming pocket ion regions for the MISFETs formed in the first regions.

7. A method for manufacturing a semiconductor integrated circuit device, comprising the steps of:

(a) providing a semiconductor substrate having a memory cell forming region, in which memory cells are to be formed, the memory cells including MISFETs of a first conductivity type to be formed in first regions of the memory cell forming region and MISFETs of a second conductivity type, opposite to the first conductivity type, to be formed in second regions of the memory cell forming region;

(b) covering the second regions of the memory cell forming region with resist films, the resist films having a thickness; and (c) introducing impurities into the memory cell forming region by oblique ion injection, in at least third and fourth directions, using the resist films as a mask, wherein thickness of the resist films, and angle of the oblique ion injection, are such that the impurities introduced by the oblique ion injection from the third and fourth directions are shielded from introduction into the first regions of the memory cell forming region, and wherein said memory cell forming region is a region in which memory cells MC1, MC2, MC3 and MC4 are to be formed, each memory cell including MISFETs of the first conductivity type to be formed in the first regions and MISFETs of the second conductivity type to be formed in the second regions; and, in introducing impurities in step (c), the thickness of the resist films, and angle of the oblique ion injection, are such that impurities introduced in the third direction are shielded from introduction into the first regions of MC1 and MC2 and are introduced into the first regions of MC3 and MC4, and such that impurities introduced in the fourth direction are shielded from introduction into the first regions of MC3 and MC4 and are introduced into the first regions of MC1 and MC2.

8. A manufacturing method of a semiconductor integrated circuit device according to claim 7, wherein the first regions of memory cells MC1, MC2, MC3 and MC4 are arranged, in the third and fourth directions, between first and second resist films, wherein the first resist film shields impurities injected in the third direction from introduction into the first regions of MC1 and MC2 but not from introduction into the first regions of MC3 and MC4; and wherein the second resist film shields impurities injected in the fourth direction from introduction into the first regions of MC3 and MC4 but not from introduction into the first regions of MC1 and MC2.

9. A manufacturing method of a semiconductor integrated circuit device according to claim 8, wherein the introduction of impurities in step (c) is for forming pocket ion regions for the MISFETs formed in the first regions.

10. A manufacturing method of a semiconductor integrated circuit device according to claim 7, wherein the introduction of impurities in step (c) is for forming pocket ion regions for the MISFETs formed in the first regions.

11. A manufacturing method of a semiconductor integrated circuit device according to claim 7, wherein each memory cell is a static random access memory, having two load MISFETs in the first regions, and two driver MISFETs and two transfer MISFETs in the second regions.

12. A method for manufacturing a semiconductor integrated circuit device, comprising the steps of:

(a) preparing a semiconductor substrate having a first region and a third region each having an n channel type MISFET formed therein and a second region and a fourth region each having a p channel type MISFET formed therein, wherein upon formation of a pocket ion region of said n channel type MISFET by oblique ion injection, said first region is formed within a distance S1, which is a product of a thickness H of a resist film and a tangent of an ion injection angle θ, from an end portion of said resist film formed over said second region; and said third region is formed apart, by a distance S1, which is a product of a thickness H of a resist film and a tangent of said ion injection angle θ, from an end portion of said resist film formed in said fourth region;

(b) forming a gate insulating film over said first region to said fourth region;

(c) forming a refractory metal film over said gate insulating film and patterning to form a gate electrode, (d) forming, over said second and fourth regions, a resist film having a thickness of H, (e) injecting p type impurities from a first direction having an angle of (90°-θ) relative to one side surface of said gate electrode in a longitudinal direction thereof and having an angle of θ relative to said surface of said semiconductor substrate and a second direction having an angle of (90°-θ) relative to the other side surface of said gate electrode in said longitudinal direction thereof and having an angle of θ relative to said surface of said semiconductor substrate, thereby forming a first pocket ion region, (f) injecting p type impurities from a third direction having an angle of (90°-θ) relative to one side surface of said gate electrode in a width direction thereof and having an angle of θ relative to said surface of said semiconductor substrate and a fourth direction having an angle of (90°-θ) relative to another side surface of said gate electrode in a width direction thereof and having an angle of θ relative to said surface of said semiconductor substrate, thereby forming a second pocket ion region, and (g) injecting n type impurities to both sides of said gate electrode to form drain and source regions.

13. A manufacturing method of a semiconductor integrated circuit device according to claim 12, wherein said n channel MISFETs formed in said first region and said p channel type MISFETs formed in said second region have two n channel type driver MISFETs and two p channel type load MISFETs, respectively and constitute a memory cell having two CMIS inverters formed of said two n channel type driver MISFETs and two p channel type load MISFETs and having respective input/output portions cross-connected to each other.

14. A manufacturing method of a semiconductor integrated circuit device according to claim 13, further comprising the steps of:

forming an interconnection over a drain region of said n channel type driver MISFET and a drain region of said p channel type load MISFET, forming a capacitor insulating film over said interconnection, and forming an upper electrode over said capacitative insulating film, thereby forming an external capacitor between said cross-connected portions.

15. A manufacturing method of semiconductor integrated circuit device according to claim 12, wherein said second pocket ion region of said n channel type MISFET in said first region has an impurity concentration lower than that in said third region.

16. A manufacturing method of a semiconductor integrated circuit device according to claim 12, wherein in the step of forming said second pocket ion region, said first region is covered with a resist film to prevent formation of said second pocket ion region of said n channel type MISFET in said first region.

17. A manufacturing method of a semiconductor integrated circuit device, comprising the steps of:

(a) preparing a semiconductor substrate having a first region and a third region each having an n channel type MISFET formed therein and a second region and a fourth region each having a p channel type MISFET formed therein, wherein upon formation of a pocket ion region of said p channel type MISFET by oblique ion injection, said second region is formed within a distance S1, which is a product of a thickness H of a resist film and a tangent of an ion injection angle θ, from an end portion of said resist film formed over said first region; and said fourth region is formed apart, by a distance S1, which is a product of a thickness H of a resist film and a tangent of said ion injection angle θ, from an end portion of said resist film formed in said third region;

(b) forming a gate insulating film over said first region to said fourth region;

(c) forming a refractory metal film over said gate insulating film and patterning to form a gate electrode, (d) forming, over said first and third regions, a resist film having a thickness of H, (e) injecting n type impurities from a first direction having an angle of (90°-θ) relative to one side surface of said gate electrode in a longitudinal direction thereof and having an angle of θ relative to said surface of said semiconductor substrate and a second direction having an angle of (90°-θ) relative to the other side surface of said gate electrode in said longitudinal direction thereof and having an angle of θ relative to said surface of said semiconductor substrate, thereby forming a first pocket ion region, (f) injecting n type impurities from a third direction having an angle of (90°-θ) relative to one side surface of said gate electrode in a width direction thereof and having an angle of θ relative to said surface of said semiconductor substrate and a fourth direction having an angle of (90°-θ) relative to the other side surface of said gate electrode in said width direction thereof and having an angle of θ relative to said surface of said semiconductor substrate, thereby forming a second pocket ion region, and (g) injecting p type impurities to both sides of said gate electrode to form source and drain regions.

18. A manufacturing method of a semiconductor integrated circuit device according to claim 17, wherein said n channel MISFETs formed in said first region and said p channel type MISFETs formed in said second region have two n channel type driver MISFETs and two p channel type load MISFETs, respectively and constitute a memory cell having two CMIS inverters made of said two n channel type driver MISFETs and two p channels type load MISFETs and having respective input/output portions cross-connected to each other.

19. A manufacturing method of a semiconductor integrated circuit device according to claim 18, further comprising the steps of:

forming an interconnection over a drain region of said n channel type driver MISFET and a drain region of said p channel type load MISFET, forming a capacitor insulating film over said interconnection, and forming an upper electrode over said capacitor insulating film, thereby forming an external capacitor between said cross-connected portions.

20. A manufacturing method of a semiconductor integrated circuit device according to claim 17, wherein said second pocket ion region of said p channel type MISFET in said second region has an impurity concentration lower than that in said fourth region.

21. A manufacturing method of a semiconductor integrated circuit device according to claim 17, wherein in the step of forming said second pocket ion region, said second region is covered with a resist film to prevent formation of said second pocket ion region of said p channel type MISFET in said second region.

* * * * *